(12) United States Patent
Tinnemans et al.

(10) Patent No.: US 11,650,047 B2
(45) Date of Patent: May 16, 2023

(54) METROLOGY APPARATUS AND METHOD FOR DETERMINING A CHARACTERISTIC OF ONE OR MORE STRUCTURES ON A SUBSTRATE

(71) Applicant: ASML Netherlands B.V., Veldhoven (NL)

(72) Inventors: Patricius Aloysius Jacobus Tinnemans, Hapert (NL); Vasco Tomas Tenner, Amsterdam (NL); Arie Jeffrey Den Boef, Waalre (NL); Hugo Augustinus Joseph Cramer, Eindhoven (NL); Patrick Warnaar, Tilburg (NL); Grzegorz Grzela, Eindhoven (NL); Martin Jacobus Johan Jak, 's-Hertogenbosch (NL)

(73) Assignee: ASML Netherlands B.V., Veldhoven (NL)

( * ) Notice: Subject to any disclaimer, the term of this patent is extended or adjusted under 35 U.S.C. 154(b) by 103 days.

(21) Appl. No.: 17/314,469

(22) Filed: May 7, 2021

(65) Prior Publication Data
US 2021/0325174 A1 Oct. 21, 2021

Related U.S. Application Data

(63) Continuation of application No. 16/277,317, filed on Feb. 15, 2019, now Pat. No. 11,009,343.

(30) Foreign Application Priority Data

Feb. 27, 2018 (EP) .................................... 18158745
Oct. 24, 2018 (EP) .................................... 18202289

(51) Int. Cl.
*G01B 11/25* (2006.01)
*G03F 7/20* (2006.01)
(Continued)

(52) U.S. Cl.
CPC ...... *G01B 11/2536* (2013.01); *G02B 27/4233* (2013.01); *G02B 27/4272* (2013.01);
(Continued)

(58) Field of Classification Search
CPC . G01B 11/2536; G03F 7/705; G03F 7/70633; G03F 7/70641; G03F 7/7065
See application file for complete search history.

(56) References Cited

U.S. PATENT DOCUMENTS 4,200,395 A 4/1980 Smith et al.
5,610,718 A 3/1997 Sentoku et al.
(Continued)

FOREIGN PATENT DOCUMENTS

| CN | 101482702 A | 7/2009 |
|---|---|---|
| CN | 102645847 A | 8/2012 |

(Continued)

OTHER PUBLICATIONS

International Search Report and Written Opinion of the International Searching Authority directed to related International Patent Application No. PCT/EP2019/052658, dated May 27, 2019; 14 pages.
(Continued)

*Primary Examiner* — Michael A Lyons
(74) *Attorney, Agent, or Firm* — Sterne, Kessler, Goldstein & Fox P.L.L.C.

(57) ABSTRACT

Disclosed is a method and associated apparatus for measuring a characteristic of interest relating to a structure on a substrate. The method comprises calculating a value for the characteristic of interest directly from the effect of the characteristic of interest on at least the phase of illuminating radiation when scattered by the structure, subsequent to illuminating said structure with said illuminating radiation.

20 Claims, 7 Drawing Sheets

(51) Int. Cl.
*G02B 27/42* (2006.01)
*G03H 1/00* (2006.01)
*G03H 1/04* (2006.01)

(52) U.S. Cl.
CPC ............ *G03F 7/705* (2013.01); *G03F 7/7065* (2013.01); *G03F 7/7085* (2013.01); *G03F 7/70508* (2013.01); *G03F 7/70633* (2013.01); *G03H 1/0005* (2013.01); *G03H 1/0443* (2013.01); *G03H 2001/0445* (2013.01)

(56) References Cited

U.S. PATENT DOCUMENTS

| | | | |
|---|---|---|---|
| 6,842,225 B1 * | 1/2005 | Irie | G03F 7/70475 355/71 |
| 6,952,253 B2 | 10/2005 | Lof et al. | |
| 7,408,642 B1 * | 8/2008 | DiBiase | G03F 7/70633 356/399 |
| 8,115,926 B2 | 2/2012 | Straaijer | |
| 9,303,978 B2 | 4/2016 | Den Boef | |
| 9,784,690 B2 | 10/2017 | Sapiens et al. | |
| 9,904,181 B2 | 2/2018 | Quintanilha | |
| 9,964,853 B2 | 5/2018 | Vanoppen et al. | |
| 10,042,268 B2 | 8/2018 | Smilde et al. | |
| 10,274,370 B2 | 4/2019 | Den Boef | |
| 10,739,687 B2 | 8/2020 | Smilde et al. | |
| 10,809,628 B2 | 10/2020 | Den Boef et al. | |
| 11,009,343 B2 | 5/2021 | Tinnemans et al. | |
| 2002/0080364 A1 | 6/2002 | Monshouwer et al. | |
| 2005/0190374 A1 | 9/2005 | Chan et al. | |
| 2008/0144036 A1 | 6/2008 | Schaar et al. | |
| 2010/0328655 A1 | 12/2010 | Den Boef | |
| 2011/0026032 A1 | 2/2011 | Den Boef et al. | |
| 2011/0102753 A1 | 5/2011 | Van De Kerkhof et al. | |
| 2011/0249244 A1 | 10/2011 | Leewis et al. | |
| 2012/0044470 A1 | 2/2012 | Smilde et al. | |
| 2013/0054186 A1 | 2/2013 | Den Boef | |
| 2015/0219438 A1 | 8/2015 | Den Boef et al. | |
| 2016/0061750 A1 | 3/2016 | Den Boef et al. | |
| 2016/0161863 A1 | 6/2016 | Den Boef et al. | |
| 2016/0161864 A1 * | 6/2016 | Middlebrooks | G03F 7/70633 355/67 |
| 2017/0052458 A1 | 2/2017 | Tang | |
| 2017/0269480 A1 | 9/2017 | Finders | |
| 2017/0329217 A1 | 11/2017 | Minoda et al. | |
| 2017/0336198 A1 | 11/2017 | Adel et al. | |
| 2018/0024054 A1 | 1/2018 | Moon et al. | |
| 2018/0088470 A1 * | 3/2018 | Bhattacharyya | G03F 7/705 |
| 2018/0196356 A1 * | 7/2018 | Bozdog | G03F 7/70466 |
| 2018/0203367 A1 | 7/2018 | Jak | |
| 2019/0265028 A1 | 8/2019 | Tinnemans et al. | |

FOREIGN PATENT DOCUMENTS

| | | | | |
|---|---|---|---|---|
| CN | 104823113 A | 8/2015 | | |
| CN | 105359039 A | 2/2016 | | |
| CN | 105549341 A | 5/2016 | | |
| CN | 106463430 A | 2/2017 | | |
| EP | 449582 B1 * | 10/2009 | ......... | G03F 7/70633 |
| EP | 1 628 164 B1 | 10/2010 | | |
| EP | 3 480 554 A1 | 5/2019 | | |
| JP | 2005-055447 A | 3/2005 | | |
| JP | 2014-186035 A | 10/2014 | | |
| JP | 2016-539370 A | 12/2016 | | |
| JP | 2017-506741 A | 3/2017 | | |
| JP | 2017-138250 A | 8/2017 | | |
| KR | 2017-0015453 A | 2/2017 | | |
| WO | WO 2011/012624 A1 | 2/2011 | | |
| WO | WO 2015/018625 A1 | 2/2015 | | |
| WO | WO 2016/187468 A1 | 11/2016 | | |
| WO | WO 2017/186483 A1 | 11/2017 | | |

OTHER PUBLICATIONS

International Preliminary Report on Patentability directed to related International Patent Application No. PCT/EP2019/052658, dated Aug. 27, 2020; 7 pages.

Non-Final Rejection directed to related U.S. Appl. No. 16/277,317, dated Jul. 7, 2020; 11 pages.

Final Rejection directed to related U.S. Appl. No. 16/277,317, dated Oct. 20, 2020; 12 pages.

Notice of Allowance directed to related U.S. Appl. No. 16/277,317, dated Jan. 19, 2021; 7 pages.

* cited by examiner

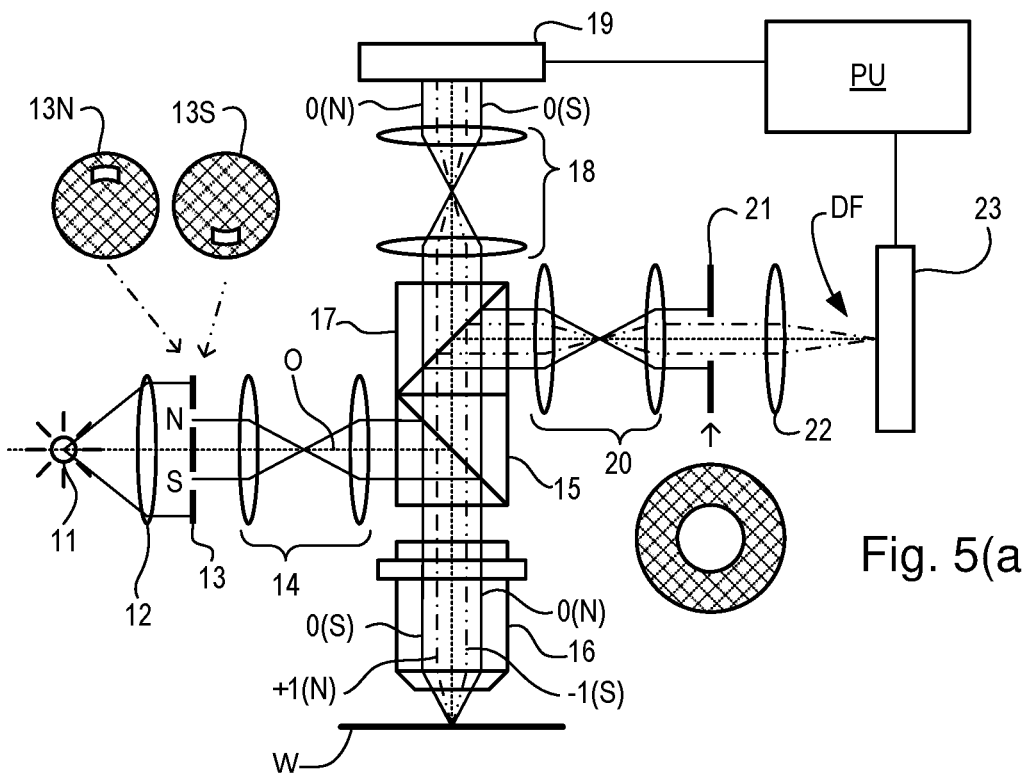
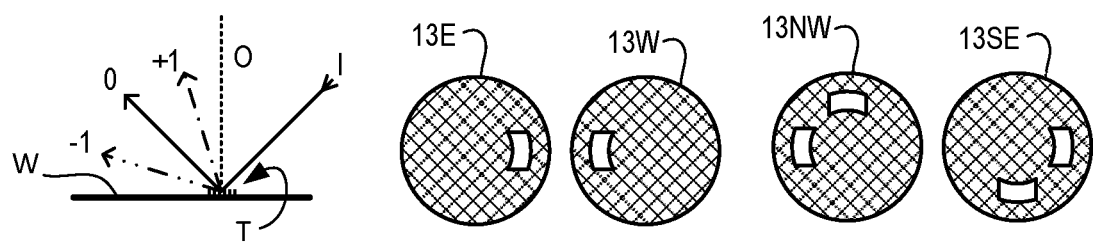
Fig. 5(a)   Fig. 5(b)   Fig. 5(c)   Fig. 5(d)
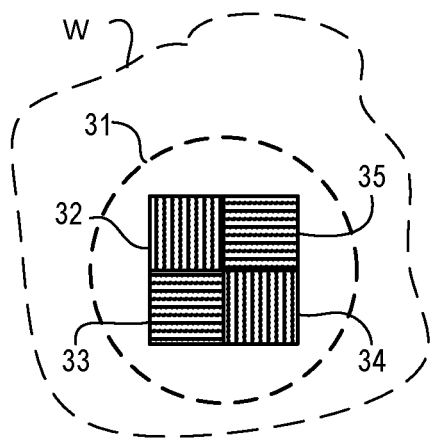
Fig. 6(a)
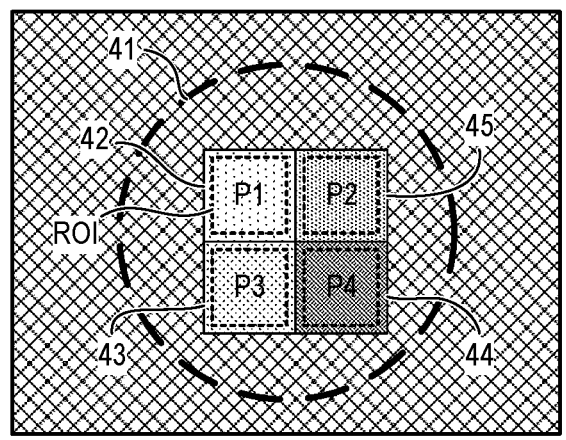
Fig. 6(b)

$|E_+|=|E_-|$ $|E_+|=|E_-|$

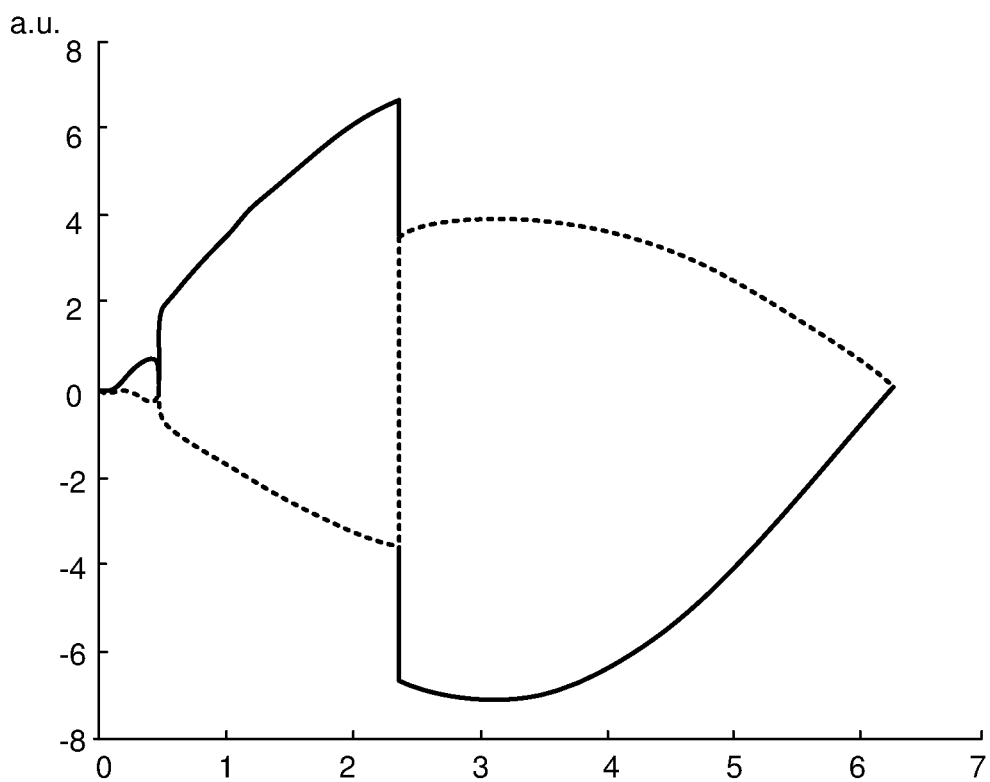
Fig. 10(a)     $\phi_\delta = 2\pi\delta$
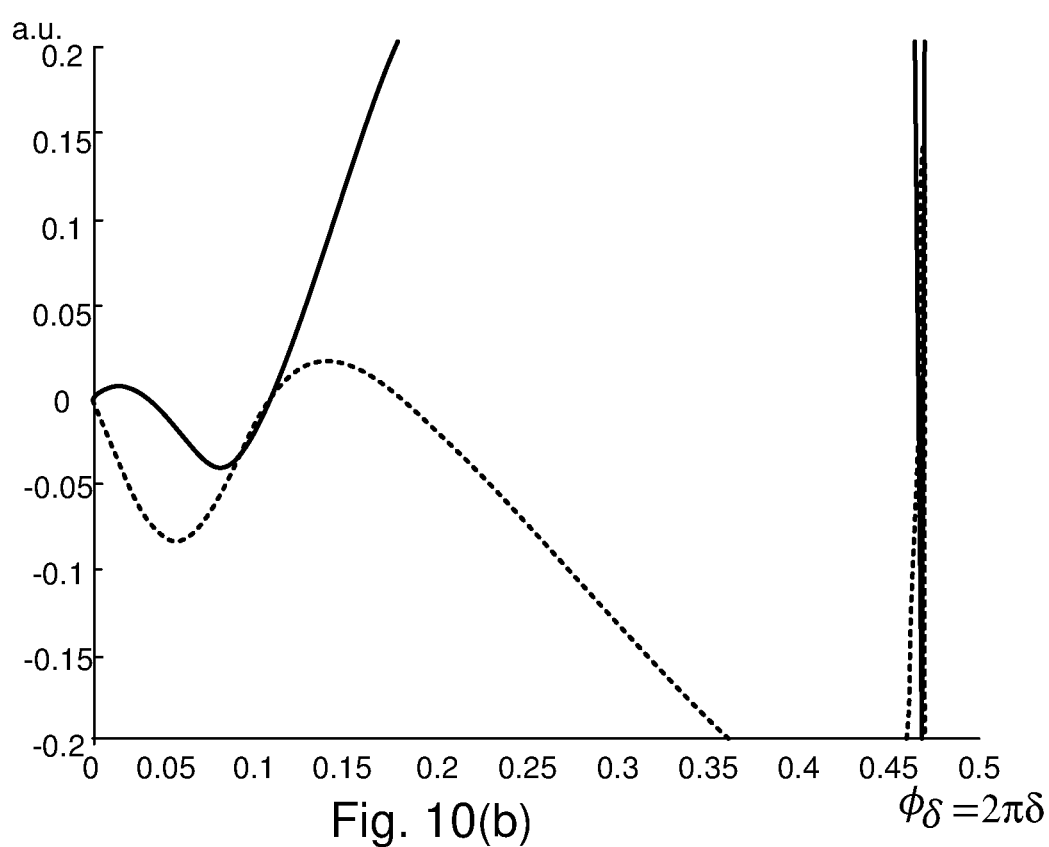
Fig. 10(b)     $\phi_\delta = 2\pi\delta$

METROLOGY APPARATUS AND METHOD FOR DETERMINING A CHARACTERISTIC OF ONE OR MORE STRUCTURES ON A SUBSTRATE

CROSS-REFERENCE TO RELATED APPLICATIONS

This application is a continuation application of U.S. patent application Ser. No. 16/277,317, filed on Feb. 15, 2019, which claims priority to European Patent Application 18158745.2, filed on Feb. 27, 2018, and European Patent Application 18202289.7, filed on Oct. 24, 2018, the entire contents of all of which are incorporated herein by reference.

FIELD

The present invention relates to a metrology apparatus or an inspection apparatus for determining a characteristic of structures on a substrate. The present invention also relates to a method for determining a characteristic of structures on a substrate.

BACKGROUND

A lithographic apparatus is a machine constructed to apply a desired pattern onto a substrate. A lithographic apparatus can be used, for example, in the manufacture of integrated circuits (ICs). A lithographic apparatus may, for example, project a pattern (also often referred to as "design layout" or "design") at a patterning device (e.g., a mask) onto a layer of radiation-sensitive material (resist) provided on a substrate (e.g., a wafer).

To project a pattern on a substrate a lithographic apparatus may use electromagnetic radiation. The wavelength of this radiation determines the minimum size of features which can be formed on the substrate. Typical wavelengths currently in use are 365 nm (i-line), 248 nm, 193 nm and 13.5 nm. A lithographic apparatus, which uses extreme ultraviolet (EUV) radiation, having a wavelength within the range 4-20 nm, for example 6.7 nm or 13.5 nm, may be used to form smaller features on a substrate than a lithographic apparatus which uses, for example, radiation with a wavelength of 193 nm.

Low-$k_1$ lithography may be used to process features with dimensions smaller than the classical resolution limit of a lithographic apparatus. In such process, the resolution formula may be expressed as $CD = k_1 \times \lambda / NA$, where $\lambda$ is the wavelength of radiation employed, NA is the numerical aperture of the projection optics in the lithographic apparatus, CD is the "critical dimension" (generally the smallest feature size printed, but in this case half-pitch) and $k_1$ is an empirical resolution factor. In general, the smaller $k_1$ the more difficult it becomes to reproduce the pattern on the substrate that resembles the shape and dimensions planned by a circuit designer in order to achieve particular electrical functionality and performance. To overcome these difficulties, sophisticated fine-tuning steps may be applied to the lithographic projection apparatus and/or design layout. These include, for example, but not limited to, optimization of NA, customized illumination schemes, use of phase shifting patterning devices, various optimization of the design layout such as optical proximity correction (OPC, sometimes also referred to as "optical and process correction") in the design layout, or other methods generally defined as "resolution enhancement techniques" (RET). Alternatively, tight control loops for controlling a stability of the lithographic apparatus may be used to improve reproduction of the pattern at low k1.

In lithographic processes, it is desirable to make frequently measurements of the structures created, e.g., for process control and verification. Various tools for making such measurements are known, including scanning electron microscopes or various forms of metrology apparatuses, such as scatterometers. A general term to refer to such tools may be metrology apparatuses or inspection apparatuses.

An issue with scatterometery based metrology to measure, for example, overlay is the so-called swing curve. The swing curve is the dependence of overlay sensitivity K on wavelength $\lambda$ using typical scatterometry techniques. The result of the swing curve is that there are some wavelengths for which the measurement is overlay insensitive. Furthermore, the swing curve varies considerably from stack-to-stack, making wavelength selection and guarantee of sufficient overlay sensitivity difficult.

SUMMARY

It is an object to provide an effective an efficient solution for an inspection or metrology apparatus that solves one or more of the above discussed problems or limitations.

Embodiments of the invention are disclosed in the claims and in the detailed description.

In a first aspect of the invention there is provided a method for measuring a characteristic of interest relating to a structure on a substrate comprising: calculating a value for the characteristic of interest directly from the effect of the characteristic of interest on at least the phase of illuminating radiation when scattered by the structure, subsequent to illuminating said structure with said illuminating radiation.

In a second aspect of the invention there is provided an inspection apparatus comprising: a substrate holder for holding the substrate comprising a structure, projection optics for projecting illuminating radiation onto the structure; a detector for detecting said illuminating radiation subsequent to it having been scattered by the structure; and a processor operable to calculate a value for a characteristic of interest relating to the structure directly from the effect of the characteristic of interest on at least the phase of illuminating radiation when scattered by the structure.

Also provided is a computer program operable to carry out the method of the first aspect.

BRIEF DESCRIPTION OF THE DRAWINGS

Embodiments of the invention will now be described, by way of example only, with reference to the accompanying schematic drawings, in which:

FIGS. 5(a)-5(d) comprise 5(a) a schematic diagram of a dark field scatterometer for use in measuring targets according to embodiments of the invention using a first pair of illumination apertures, 5(b) a detail of diffraction spectrum of a target grating for a given direction of illumination 5(c) a second pair of illumination apertures providing further illumination modes in using the scatterometer for diffraction based overlay measurements and 5(d) a third pair of illumination apertures combining the first and second pair of apertures;

FIGS. 6(a)-6(b) depict 6(a) a known form of multiple grating target and an outline of a measurement spot on a substrate; and 6(b) an image of the target obtained in the scatterometer of FIG. 5;

FIG. 10(a) comprises an arbitrary plot of the value for an equation as a function of the unknown target bias $\phi_\delta$, with FIG. 10(b) being a detail thereof, illustrating the step of performing a numerical determination of a deliberate target bias; usable as a performance metric according to an embodiment of the invention;

DETAILED DESCRIPTION

In the present document, the terms "radiation" and "beam" are used to encompass all types of electromagnetic radiation, including ultraviolet radiation (e.g. with a wavelength of 365, 248, 193, 157 or 126 nm) and EUV (extreme ultra-violet radiation, e.g. having a wavelength in the range of about 5-100 nm).

The term "reticle", "mask" or "patterning device" as employed in this text may be broadly interpreted as referring to a generic patterning device that can be used to endow an incoming radiation beam with a patterned cross-section, corresponding to a pattern that is to be created in a target portion of the substrate. The term "light valve" can also be used in this context. Besides the classic mask (transmissive or reflective, binary, phase-shifting, hybrid, etc.), examples of other such patterning devices include a programmable mirror array and a programmable LCD array.

Figure 1:
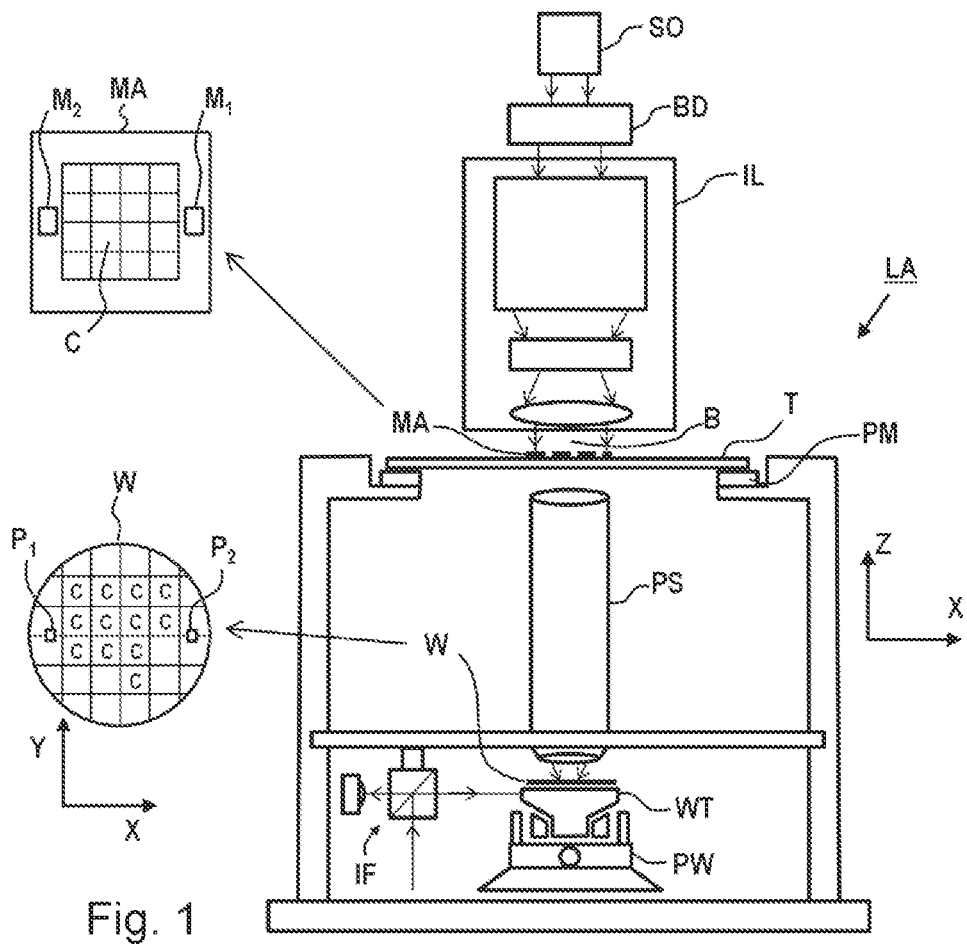
FIG. 1 depicts a schematic overview of a lithographic apparatus.

FIG. 1 schematically depicts a lithographic apparatus LA. The lithographic apparatus LA includes an illumination system (also referred to as illuminator) IL configured to condition a radiation beam B (e.g., UV radiation, DUV radiation or EUV radiation), a mask support (e.g., a mask table) MT constructed to support a patterning device (e.g., a mask) MA and connected to a first positioner PM configured to accurately position the patterning device MA in accordance with certain parameters, a substrate support (e.g., a wafer table) WT constructed to hold a substrate (e.g., a resist coated wafer) W and connected to a second positioner PW configured to accurately position the substrate support in accordance with certain parameters, and a projection system (e.g., a refractive projection lens system) PS configured to project a pattern imparted to the radiation beam B by patterning device MA onto a target portion C (e.g., comprising one or more dies) of the substrate W.

In operation, the illumination system IL receives a radiation beam from a radiation source SO, e.g. via a beam delivery system BD. The illumination system IL may include various types of optical components, such as refractive, reflective, magnetic, electromagnetic, electrostatic, and/or other types of optical components, or any combination thereof, for directing, shaping, and/or controlling radiation. The illuminator IL may be used to condition the radiation beam B to have a desired spatial and angular intensity distribution in its cross section at a plane of the patterning device MA.

The term "projection system" PS used herein should be broadly interpreted as encompassing various types of projection system, including refractive, reflective, catadioptric, anamorphic, magnetic, electromagnetic and/or electrostatic optical systems, or any combination thereof, as appropriate for the exposure radiation being used, and/or for other factors such as the use of an immersion liquid or the use of a vacuum. Any use of the term "projection lens" herein may be considered as synonymous with the more general term "projection system" PS.

The lithographic apparatus LA may be of a type wherein at least a portion of the substrate may be covered by a liquid having a relatively high refractive index, e.g., water, so as to fill a space between the projection system PS and the substrate W—which is also referred to as immersion lithography. More information on immersion techniques is given in U.S. Pat. No. 6,952,253, which is incorporated herein by reference.

The lithographic apparatus LA may also be of a type having two or more substrate supports WT (also named "dual stage"). In such "multiple stage" machine, the substrate supports WT may be used in parallel, and/or steps in preparation of a subsequent exposure of the substrate W may be carried out on the substrate W located on one of the substrate support WT while another substrate W on the other substrate support WT is being used for exposing a pattern on the other substrate W.

In addition to the substrate support WT, the lithographic apparatus LA may comprise a measurement stage. The measurement stage is arranged to hold a sensor and/or a cleaning device. The sensor may be arranged to measure a property of the projection system PS or a property of the radiation beam B. The measurement stage may hold multiple sensors. The cleaning device may be arranged to clean part of the lithographic apparatus, for example a part of the projection system PS or a part of a system that provides the immersion liquid. The measurement stage may move beneath the projection system PS when the substrate support WT is away from the projection system PS.

In operation, the radiation beam B is incident on the patterning device, e.g. mask, MA which is held on the mask support MT, and is patterned by the pattern (design layout) present on patterning device MA. Having traversed the mask MA, the radiation beam B passes through the projection system PS, which focuses the beam onto a target portion C of the substrate W. With the aid of the second positioner PW and a position measurement system IF, the substrate support WT can be moved accurately, e.g., so as to position different target portions C in the path of the radiation beam B at a focused and aligned position. Similarly, the first positioner PM and possibly another position sensor (which is not explicitly depicted in FIG. 1) may be used to accurately position the patterning device MA with respect to the path of the radiation beam B. Patterning device MA and substrate W may be aligned using mask alignment marks M1, M2 and substrate alignment marks P1, P2. Although the substrate alignment marks P1, P2 as illustrated occupy dedicated target portions, they may be located in spaces between target portions. Substrate alignment marks P1, P2 are known as scribe-lane alignment marks when these are located between the target portions C.

Figure 2:
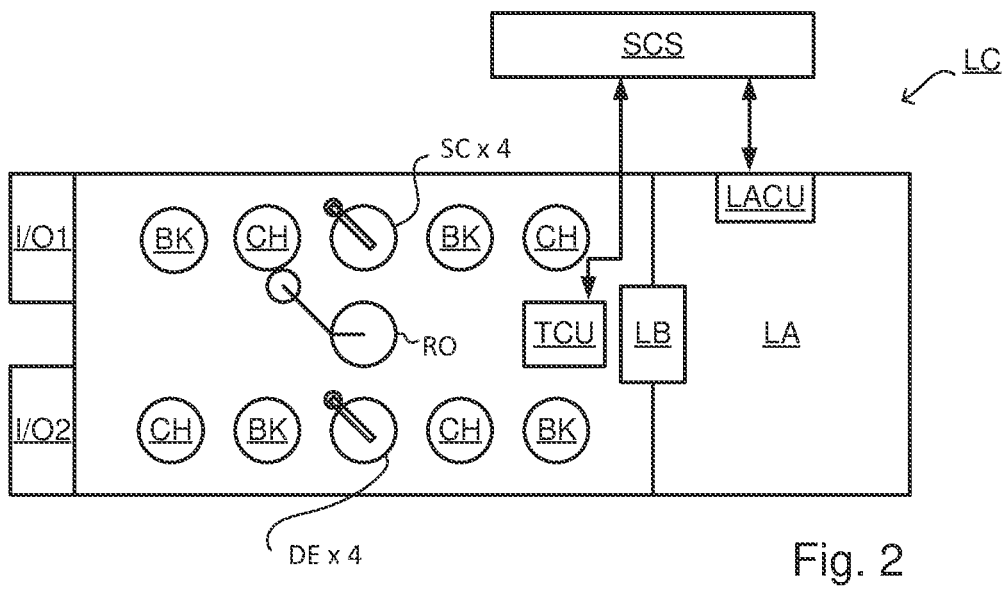
FIG. 2 depicts a schematic overview of a lithographic cell.

As shown in FIG. 2 the lithographic apparatus LA may form part of a lithographic cell LC, also sometimes referred to as a lithocell or (litho)cluster, which often also includes apparatus to perform pre- and post-exposure processes on a substrate W. Conventionally these include spin coaters SC to deposit resist layers, developers DE to develop exposed resist, chill plates CH and bake plates BK, e.g. for conditioning the temperature of substrates W e.g. for conditioning solvents in the resist layers. A substrate handler, or robot, RO picks up substrates W from input/output ports I/O1, I/O2, moves them between the different process apparatus and delivers the substrates W to the loading bay LB of the lithographic apparatus LA. The devices in the lithocell, which are often also collectively referred to as the track, are typically under the control of a track control unit TCU that in itself may be controlled by a supervisory control system SCS, which may also control the lithographic apparatus LA, e.g. via lithography control unit LACU.

In order for the substrates W exposed by the lithographic apparatus LA to be exposed correctly and consistently, it is desirable to inspect substrates to measure properties of patterned structures, such as overlay errors between subsequent layers, line thicknesses, critical dimensions (CD), etc. For this purpose, inspection tools (not shown) may be included in the lithocell LC. If errors are detected, adjustments, for example, may be made to exposures of subsequent substrates or to other processing steps that are to be performed on the substrates W, especially if the inspection is done before other substrates W of the same batch or lot are still to be exposed or processed.

An inspection apparatus, which may also be referred to as a metrology apparatus, is used to determine properties of the substrates W, and in particular, how properties of different substrates W vary or how properties associated with different layers of the same substrate W vary from layer to layer. The inspection apparatus may alternatively be constructed to identify defects on the substrate W and may, for example, be part of the lithocell LC, or may be integrated into the lithographic apparatus LA, or may even be a stand-alone device. The inspection apparatus may measure the properties on a latent image (image in a resist layer after the exposure), or on a semi-latent image (image in a resist layer after a post-exposure bake step PEB), or on a developed resist image (in which the exposed or unexposed parts of the resist have been removed), or even on an etched image (after a pattern transfer step such as etching).

Figure 3:
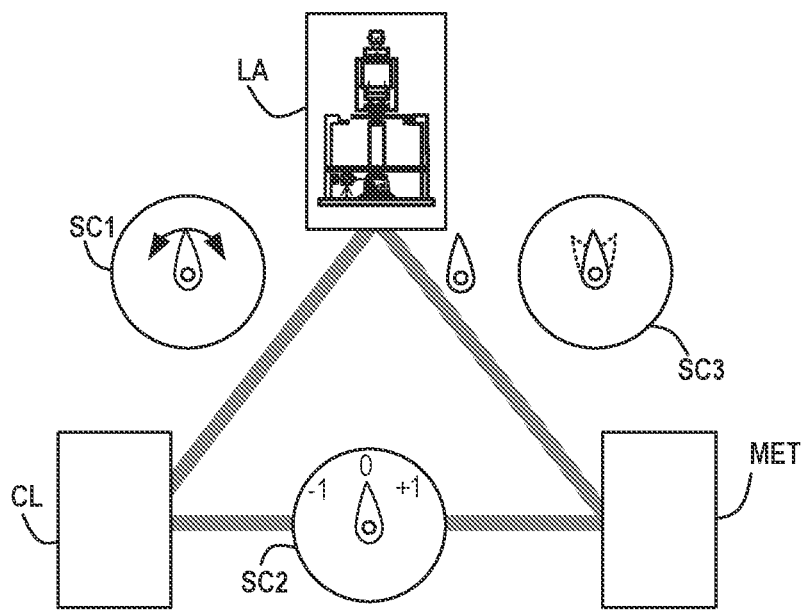
FIG. 3 depicts a schematic representation of holistic lithography, representing a cooperation between three key technologies to optimize semiconductor manufacturing.

Typically the patterning process in a lithographic apparatus LA is one of the most critical steps in the processing which requires high accuracy of dimensioning and placement of structures on the substrate W. To ensure this high accuracy, three systems may be combined in a so called "holistic" control environment as schematically depicted in FIG. 3. One of these systems is the lithographic apparatus LA which is (virtually) connected to a metrology tool MET (a second system) and to a computer system CL (a third system). The key of such "holistic" environment is to optimize the cooperation between these three systems to enhance the overall process window and provide tight control loops to ensure that the patterning performed by the lithographic apparatus LA stays within a process window. The process window defines a range of process parameters (e.g. dose, focus, overlay) within which a specific manufacturing process yields a defined result (e.g. a functional semiconductor device)—typically within which the process parameters in the lithographic process or patterning process are allowed to vary.

The computer system CL may use (part of) the design layout to be patterned to predict which resolution enhancement techniques to use and to perform computational lithography simulations and calculations to determine which mask layout and lithographic apparatus settings achieve the largest overall process window of the patterning process (depicted in FIG. 3 by the double arrow in the first scale SC1). Typically, the resolution enhancement techniques are arranged to match the patterning possibilities of the lithographic apparatus LA. The computer system CL may also be used to detect where within the process window the lithographic apparatus LA is currently operating (e.g. using input from the metrology tool MET) to predict whether defects may be present due to e.g. sub-optimal processing (depicted in FIG. 3 by the arrow pointing "0" in the second scale SC2).

The metrology tool MET may provide input to the computer system CL to enable accurate simulations and predictions, and may provide feedback to the lithographic apparatus LA to identify possible drifts, e.g. in a calibration status of the lithographic apparatus LA (depicted in FIG. 3 by the multiple arrows in the third scale SC3).

In lithographic processes, it is desirable to make frequently measurements of the structures created, e.g., for process control and verification. Various tools for making such measurements are known, including scanning electron microscopes or various forms of metrology apparatuses, such as scatterometers. Examples of known scatterometers often rely on provision of dedicated metrology targets, such as underfilled targets (a target, in the form of a simple grating or overlapping gratings in different layers, that is large enough that a measurement beam generates a spot that is smaller than the grating) or overfilled targets (whereby the illumination spot partially or completely contains the target). Further, the use of metrology tools, for example an angular resolved scatterometer illuminating an underfilled target, such as a grating, allows the use of so-called reconstruction methods where the properties of the grating can be calculated by simulating interaction of scattered radiation with a mathematical model of the target structure and comparing the simulation results with those of a measurement. Parameters of the model are adjusted until the simulated interaction produces a diffraction pattern similar to that observed from the real target.

Scatterometers are versatile instruments which allow measurements of the parameters of a lithographic process by having a sensor in the pupil or a conjugate plane with the pupil of the objective of the scatterometer, measurements usually referred as pupil based measurements, or by having the sensor in the image plane or a plane conjugate with the image plane, in which case the measurements are usually referred as image or field based measurements. Such scatterometers and the associated measurement techniques are further described in patent applications US20100328655, US201102753A1, US20120044470A, US20110249244, US20110026032 or EP1,628,164A, incorporated herein by reference in their entirety. Aforementioned scatterometers can measure in one image multiple targets from multiple gratings using light from soft x-ray and visible to near-IR wave range.

Figure 4:
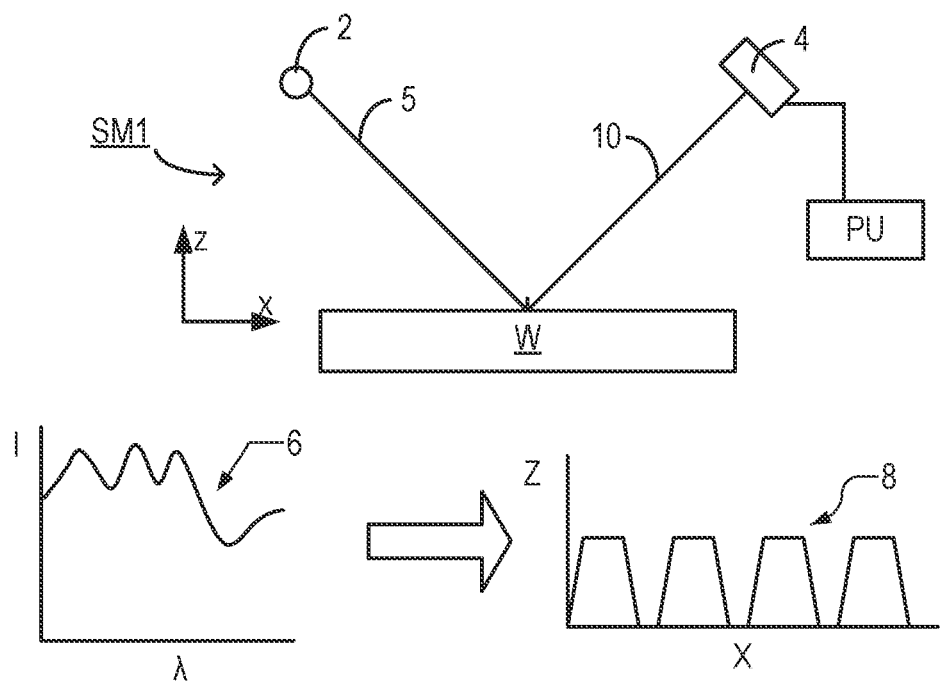
FIG. 4 illustrates an inspection apparatus according to an embodiment of the invention.

A metrology apparatus, such as a scatterometer, is depicted in FIG. 4. It comprises a broadband (white light) radiation projector 2 which projects radiation 5 onto a substrate W. The reflected or scattered radiation 10 is passed to a spectrometer detector 4, which measures a spectrum 6

(i.e. a measurement of intensity I as a function of wavelength λ) of the specular reflected radiation 10. From this data, the structure or profile 8 giving rise to the detected spectrum may be reconstructed by processing unit PU, e.g. by Rigorous Coupled Wave Analysis and non-linear regression or by comparison with a library of simulated spectra. In general, for the reconstruction, the general form of the structure is known and some parameters are assumed from knowledge of the process by which the structure was made, leaving only a few parameters of the structure to be determined from the scatterometry data. Such a scatterometer may be configured as a normal-incidence scatterometer or an oblique-incidence scatterometer.

A metrology apparatus suitable for use in embodiments of the invention is shown in FIG. 5(a). Note that this is only one example of a suitable metrology apparatus. An alternative suitable metrology apparatus may use EUV radiation such as, for example, that disclosed in WO2017/186483A1. A target structure T and diffracted rays of measurement radiation used to illuminate the target structure are illustrated in more detail in FIG. 5(b). The metrology apparatus illustrated is of a type known as a dark field metrology apparatus. The metrology apparatus may be a stand-alone device or incorporated in either the lithographic apparatus LA, e.g., at the measurement station, or the lithographic cell LC. An optical axis, which has several branches throughout the apparatus, is represented by a dotted line 0. In this apparatus, light emitted by source 11 (e.g., a xenon lamp) is directed onto substrate W via a beam splitter 15 by an optical system comprising lenses 12, 14 and objective lens 16. These lenses are arranged in a double sequence of a 4F arrangement. A different lens arrangement can be used, provided that it still provides a substrate image onto a detector, and simultaneously allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary light outside the desired illumination mode will interfere with the desired measurement signals.

As shown in FIG. 5(b), target structure T is placed with substrate W normal to the optical axis O of objective lens 16. The substrate W may be supported by a support (not shown). A ray of measurement radiation I impinging on target structure T from an angle off the axis O gives rise to a zeroth order ray (solid line 0) and two first order rays (dot-chain line +1 and double dot-chain line −1). It should be remembered that with an overfilled small target structure, these rays are just one of many parallel rays covering the area of the substrate including metrology target structure T and other features. Since the aperture in plate 13 has a finite width (necessary to admit a useful quantity of light, the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the grating pitches of the target structures and the illumination angles can be designed or adjusted so that the first order rays entering the objective lens are closely aligned with the central optical axis. The rays illustrated in FIGS. 5(a) and 3(b) are shown somewhat off axis, purely to enable them to be more easily distinguished in the diagram.

At least the 0 and +1 orders diffracted by the target structure T on substrate W are collected by objective lens 16 and directed back through beam splitter 15. Returning to FIG. 5(a), both the first and second illumination modes are illustrated, by designating diametrically opposite apertures labeled as north (N) and south (S). When the incident ray I of measurement radiation is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled 1(S)) are the ones which enter the lens 16.

A second beam splitter 17 divides the diffracted beams into two measurement branches. In a first measurement branch, optical system 18 forms a diffraction spectrum (pupil plane image) of the target structure on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction.

In the second measurement branch, optical system 20, 22 forms an image of the target structure T on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image of the target formed on sensor 23 is formed only from the −1 or +1 first order beam. The images captured by sensors 19 and 23 are output to processor PU which processes the image, the function of which will depend on the particular type of measurements being performed. Note that the term 'image' is used here in a broad sense. An image of the grating lines as such will not be formed, if only one of the −1 and +1 orders is present.

The particular forms of aperture plate 13 and field stop 21 shown in FIG. 5 are purely examples. In another embodiment of the invention, on-axis illumination of the targets is used and an aperture stop with an off-axis aperture is used to pass substantially only one first order of diffracted light to the sensor. In yet other embodiments, 2nd, 3rd and higher order beams (not shown in FIG. 5) can be used in measurements, instead of or in addition to the first order beams.

In order to make the measurement radiation adaptable to these different types of measurement, the aperture plate 13 may comprise a number of aperture patterns formed around a disc, which rotates to bring a desired pattern into place. Note that aperture plate 13N or 13S can only be used to measure gratings oriented in one direction (X or Y depending on the set-up). For measurement of an orthogonal grating, rotation of the target through 90° and 270° might be implemented. Different aperture plates are shown in FIGS.

3(c) and (d). The use of these, and numerous other variations and applications of the apparatus are described in prior published applications, mentioned above.

FIG. 6(a) depicts a target structure or composite target formed on a substrate according to known practice. The target structure in this example comprises four targets (e.g., gratings) 32 to 35 positioned closely together so that they will all be within a measurement spot 31 formed by the metrology radiation illumination beam of the metrology apparatus. The four targets thus are all simultaneously illuminated and simultaneously imaged on sensors 19 and 23. In an example dedicated to measurement of overlay, targets 32 to 35 are themselves composite gratings formed by overlying gratings that are patterned in different layers of the semi-conductor device formed on substrate W. Targets 32 to 35 may have differently biased overlay offsets in order to facilitate measurement of overlay between the layers in which the different parts of the composite gratings are formed. The meaning of overlay bias will be explained below with reference to FIG. 7. Targets 32 to 35 may also differ in their orientation, as shown, so as to diffract incoming radiation in X and Y directions. In one example, targets 32 and 34 are X-direction gratings with biases of the +d, −d, respectively. Targets 33 and 35 are Y-direction gratings with offsets +d and −d respectively. Separate images of these gratings can be identified in the image captured by sensor 23. This is only one example of a target structure. A target structure may comprise more or fewer than 4 targets, or only a single target.

FIG. 6(b) shows an example of an image that may be formed on and detected by the sensor 23, using the target of FIG. 6(a) in the apparatus of FIG. 5, using the aperture plates 13NW or 13SE from FIG. 5(d). While the pupil plane image sensor 19 cannot resolve the different individual targets 32 to 35, the image sensor 23 can do so. The dark rectangle represents the field of the image on the sensor, within which the illuminated spot 31 on the substrate is imaged into a corresponding circular area 41. Within this, rectangular areas 42-45 represent the images of the small target gratings 32 to 35. If the targets are located in product areas, product features may also be visible in the periphery of this image field. Image processor and controller PU processes these images using pattern recognition to identify the separate images 42 to 45 of targets 32 to 35. In this way, the images do not have to be aligned very precisely at a specific location within the sensor frame, which greatly improves throughput of the measuring apparatus as a whole.

Once the separate images of the targets have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an important example of such a parameter.

In one embodiment of the metrology apparatus (e.g., scatterometer), the metrology apparatus is adapted to measure the overlay of two misaligned gratings or periodic structures by measuring asymmetry in the reflected spectrum and/or the detection configuration, the asymmetry being related to the extent of the overlay. A similar method may be used to measure focus on special targets which are formed with a focus dependent asymmetry. In the overlay case, the two (typically overlapping) grating structures may be applied in two different layers (not necessarily consecutive layers), and may be formed substantially at the same position on the wafer. The scatterometer may have a symmetrical detection configuration as described e.g. in co-owned patent application EP1,628,164A, such that any asymmetry is clearly distinguishable. This provides a straightforward way to measure misalignment in gratings. Further examples for measuring overlay error between the two layers containing periodic structures as target is measured through asymmetry of the periodic structures may be found in PCT patent application publication no. WO 2011/012624 or US patent application US 20160161863, incorporated herein by reference in its entirety.

For diffraction based overlay (DBO) metrology, the overlay is derived using only intensity information from radiation diffracted by stacked gratings. This yields a measurement sensitivity that is highly wavelength dependent, due to the refractive index of the stack being measured. This wavelength dependency, often described by a swing curve, is also highly dependent on the composition and thickness of the stack which results in a process-robustness challenge.

Figure 7:
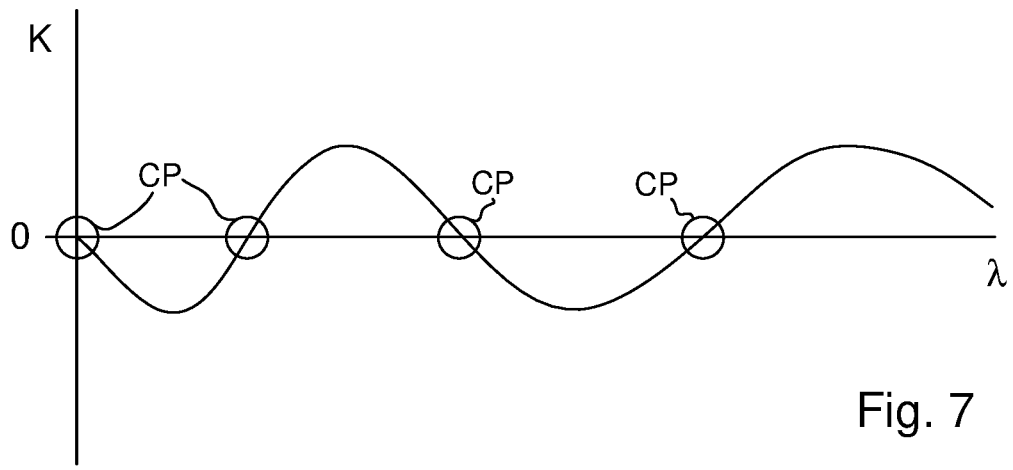
FIG. 7 shows a swing curve showing the dependence of overlay sensitivity K on wavelength λ using a known method.

FIG. 7 is an exemplary swing curve, comprising a plot of overlay sensitivity K against wavelength λ, which illustrates this issue. As can be seen, there are a number of crossing points CP. These crossing points CP correspond to wavelengths for which the overlay sensitivity K, more specifically the intensity based overlay sensitivity, is zero, and therefore the diffraction based overlay method is insensitive to overlay using these wavelengths. As such, absorption of illuminating (measurement) radiation within a stack being measured typically limits the wavelengths available for high quality metrology. Furthermore, because the swing curve varies for different stacks, simply ensuring that the illuminating radiation used for measurement avoids these wavelengths is not trivial.

Measuring with a larger wavelength range (e.g., from DUV to IR) may be desired to deal with challenging stacks and applications. At the same time it is desirable to improve dynamic range (i.e., allowable diffraction efficiencies of the target) and measurement speed. It is difficult to realize this with a classical high NA optical sensor design because of the large number of optical surfaces typically comprised in existing metrology apparatus sensors. "Computational Imaging" (CI) may provide a solution as described in patent application EP17199764, which is incorporated herein by reference.

In CI, the high-quality and high-NA imaging optics are replaced by a simple single lens, for example, which creates a relatively distorted and aberrated image of the metrology target(s) on an image sensor. A near-perfect image of metrology targets can be retrieved when the full field (both intensity and phase) of the light on the sensor is known by direct phase resolved measurements (e.g. holographic microscopy) or by phase retrieval methods (phase is retrieved from intensity measurements only). In phase resolved measurements, the full electric field on the sensor can be observed by using a holographic setup and applied knowledge regarding the imaging system. Phase retrieval methods may use a phase retrieval algorithm and prior knowledge relating to the imaging system and/or the metrology targets. Examples of suitable phase retrieval methods have been described in the aforementioned patent application EP17199764.6 filed on Nov. 2, 2017.

A method is proposed for measuring overlay (i.e., a relative positional offset between layers), which is overlay sensitive at all wavelengths. As such, application of the proposed overlay metrology method will not be limited by a swing curve. This is achieved by performing a phase sensitive (full-field) measurement, and determining the overlay directly from the phase sensitive measurement values. More specifically, the overlay can be calculated from a determination of the phase delay contribution in the scattered (e.g., diffracted) radiation which results from overlay. By measuring both the amplitude (or intensity) and phase of diffraction orders in radiation scattered by overlay targets, the swing curve (i.e., overlay sensitivity dependence to wavelength used) can (partly) be eliminated.

Illumination of a stacked grating structure (overlay target) results in scattering of the illuminating radiation by the target. The resulting diffraction orders in the scattered radiation comprise information describing the overlay between the two gratings of which each target is comprised. The scattered light field consists of a diffraction from the top grating (described by a top grating diffracted field $\underline{E}_t$) and from the bottom grating (described by a bottom grating diffracted field $\underline{E}_b$). Note that both of these diffracted fields are described by complex numbers, which is signified by their underscore notation. It will be appreciated that extension to the full vectorial scattering case is trivial for someone knowledgeable in the art.

The full field $\underline{E}$ at the detector plane will therefore comprise the sum of the top grating and bottom grating diffracted fields (for the approximate case of ignoring higher order scattering inside of the target); i.e., $\underline{E}=\underline{E}_t+\underline{E}_b$. The relative phase $\phi$ between the two diffracted fields $\underline{E}_t$, $\underline{E}_b$ comprises a first phase delay contribution due to the stack $\phi_{stack}$ and a second phase delay contribution $\phi_{OV}$ due to overlay OV (including any intentional bias $\delta$), i.e., $$\phi = \phi_{OV} + \phi_{stack} \qquad \text{Equation (1)}$$

where:

$$\phi_{OV} = 2\pi(OV+\delta)\frac{\sin(\theta)}{\lambda} \qquad \text{Equation (2)}$$

and where $\lambda$ is the wavelength of the measurement radiation and $\theta$ is the angle of incidence of the measurement radiation with respect to the target.

Figure 8A:
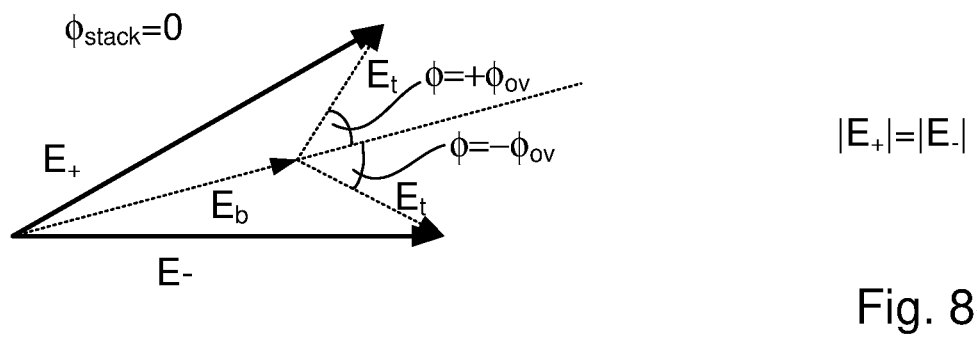
FIGS. 8(a) and 8(b) demonstrate schematically two scenarios where intensity only measurements would be overlay insensitive.
Figure 8B:
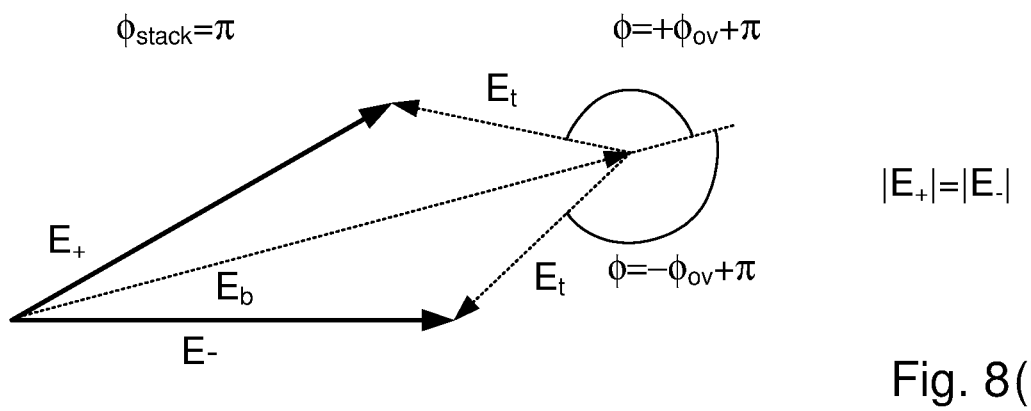

In most typical DBO metrology methods, only the intensity $|\underline{E}|^2$ (i.e., the length of this vector $\underline{E}$) is captured, and hence the phase information is lost. The result of this is the swing curve. FIG. 8 demonstrates schematically two scenarios where intensity only measurements would be overlay insensitive. In FIG. 8(a) the first phase delay contribution due to the stack $\phi_{stack}$ is zero and in FIG. 8(b) this phase delay $\phi_{stack}$ is $\pi$. The complex field of each of the +1 and −1 grating order are visualized in the complex plane. For intensity only metrology, only the intensity of the field (the length of the vectors) is captured. In both cases, it would look like there is no asymmetry and therefore no positional offset (overlay=0). This can be overcome by capturing the full field (amplitude and phase) $\underline{E}_+$ and $\underline{E}_-$ for each of the +1 and −1 diffraction orders, respectively. By capturing the full field instead of only the magnitude, the second phase delay contribution $\phi_{OV}$ (i.e., the overlay induced phase shift) can be directly determined, and therefore such a measurement can be made sensitive to overlay.

In the following paragraphs, methods for retrieval of the second phase delay contribution $\phi_{OV}$ will be described. The second phase delay contribution $\phi_{OV}$ can be determined from the relative phases $\phi_+$ and $\phi_-$ of the +1 order and the −1 order, respectively by:

$$\phi_+ = \phi_{stack} + \phi_{OV}$$

$$\phi_- = \phi_{stack} - \phi_{OV} \qquad \text{Equation (3)+}$$

Overlay can then be determined from the second phase delay contribution $\phi_{OV}$. In DBO techniques, the relative phase difference between $\phi_+=\phi_{+b}-\phi_{+t}$ (and similarly for $\phi_-=\phi_{-b}-\phi_{-t}$) between the fields diffracted by the bottom and top gratings (where the b and t subscripts denote these bottom and top gratings respectively) cannot be accessed directly as the phases $\phi_{+t}$, $\phi_{-t}$ is generally not known. A number of methods for retrieving the relative phases $\phi_+$ and $\phi_-$ of the +1 order and the −1 order will now be described. Note that, while the examples provided refer to the +1 and −1 diffraction orders, any pairs of corresponding higher orders (e.g., +2, −2 etc.) may instead be used.

Because amplitude (or intensity) and phase is being captured, it is proposed that spatially (partially) coherent radiation is used to measure the target. The target being measured may take the form of known DBO type compound targets, although it should be appreciated that the concepts described herein are applicable to any scatterometry based metrology using any suitable target design. As such the target may comprise two (sub)targets, or optionally two (sub)targets per direction: i.e., separate pairs of targets for capturing overlay in the x-direction and y-direction, the two targets differing in their deliberate bias $\delta$ imposed between the component gratings. In an embodiment, both targets may have a different imposed bias $\delta_1$, $\delta_2$. For the remainder of the description, however, a proposed target arrangement will comprise a first target with deliberate imposed bias $\delta$ and a second target without any deliberate bias.

In an embodiment, each target is illuminated with spatially coherent radiation. The full field of the +1 and −1 diffraction orders from both gratings $\underline{E}_+$, $\underline{E}_-$ and $\underline{E}_{+\delta}$, $\underline{E}_{-\delta}$ may be determined coherently (via direct, holographic, and/or via phase retrieval methods). These fields comprise: a first positive higher order diffracted field $\underline{E}_{+\delta}$, comprising the full field as captured from a positive diffraction order (e.g., +1) diffracted from the first (biased) target, a second positive higher order diffracted field $\vec{E}_+$ comprising the full field as captured from a positive diffraction order (e.g., +1) diffracted from the second (unbiased) target, a first negative higher order diffracted field $\underline{E}_{-\delta}$ comprising the full field as captured from a negative diffraction order (e.g., −1) diffracted from the first (biased) target, and a second negative higher order diffracted field $\underline{E}_-$ comprising the full field as captured from a negative diffraction order (e.g., −1) diffracted from the second (unbiased) target.

In a first embodiment, an algorithm for absolute coherent measurement is proposed. In such an embodiment, only one target and two absolute phase measurements are required. The overlay can be retrieved from a coherent measurement of the +1 and −1 diffraction orders of a single target, provided that the absolute phase shift of the diffraction from the top grating is known (this can be determined, for example, using holography methods). To achieve this, the x and z position of the top grating should be determined with greater accuracy than the desired overlay resolution. The determination of the x position can be derived from an image of the target. This embodiment resembles imaged based overlay measurements and has many of its deficiencies.

In such an embodiment, the overlay induced phase shift $\phi_{OV}$ can be calculated from:

$$\phi_{OV} = \frac{1}{2}\arg\left(-e^{-i\phi_\delta}\frac{E_+ - E_{+\delta}}{E_- - E_{-\delta}}\right) \qquad \text{Equation (4)}$$

or $$\phi_{OV} = \arctan\left(\frac{\sin\phi_\delta}{\frac{E_{+\delta} - E_{-\delta}}{E_+ - E_-} - \cos\phi_\delta}\right) \quad \text{Equation (5)}$$

where the bias induced phase shift $\phi_\delta = 2\pi\delta$. It should be noted that measurement noise may make the angle $\phi_{OV}$ complex. This can be addressed by ensuring that the angle is always real valued.

In a second, fully coherent measurement embodiment, no absolute phase determination is required. Instead, two targets (e.g., as described: a first target with bias $\delta$ and a second target with no bias) are measured and the relative phases between the four diffracted fields $\underline{E}_-$, $\underline{E}_{-\delta}$, $\underline{E}_+$, $\underline{E}_{+\delta}$ (i.e., the fields relating to each of the +1 and -1 diffraction orders and from each of the targets) are captured. The overlay induced phase shift $\phi_{OV}$ can then be calculated according to the following formula:

$$e^{-i2\phi_{OV}} = \frac{(E_- - E_{-\delta})}{(E_+ - E_{+\delta})} \quad \text{Equation (6)}$$

where the bias $\delta$ equals half the grating pitch p ($\delta = p/2$). This specific bias is not a requirement, but simplifies the calculation for the overlay induced phase shift $\phi_{OV}$. This approach may be best suited for metrology arrangements which capture both the +1 and -1 diffraction orders simultaneously; for example, metrology arrangements which use a normal (or near normal) incidence for the measurement beam with respect to the target. For such arrangements, the relative phases between the four fields can be captured relatively simply. Alternatively, the wafer may be rotated to measure both the positive and negative diffraction orders.

The above embodiment can be refined into a partially coherent measurement embodiment, such that only knowledge of the relative phase between diffracted fields relating to the positive diffraction orders $\underline{E}_+$, $\underline{E}_{+\delta}$, and of the relative phase between diffracted fields relating to the negative diffraction orders $\underline{E}_-$, $\underline{E}_{-\delta}$ are required. This embodiment may be useful, for example, when using a metrology arrangement which uses off-axis illumination, where the measurement beam may be anything up to, e.g., 80 degrees from normal. In such an arrangement, the positive and negative diffraction orders may be captured separately (e.g., in separate acquisitions) and therefore the relative phases between them may not be available. As such, the overlay induced phase shift $\phi_{OV}$ in this embodiment can be retrieved from combinations of fields $\underline{E}_+$, $\underline{E}_{+\delta}$ and combinations of fields $\underline{E}_-$, $\underline{E}_{-\delta}$.

As already mentioned, the relative phase difference between top and bottom gratings cannot be measured directly as the phase of the field diffracted from the top grating is not known. However, when the phase relation between the top gratings of the first and second targets is known, then the phases $\phi_+$, $\phi_-$ can be retrieved as follows:

From fields $\underline{E}_+$ and $\underline{E}_{+\delta}$, the +1 diffracted field from the top grating $\underline{E}_{+t}$ and the +1 diffracted field from the bottom grating $\underline{E}_{+b}$ can be determined:

$$E_+ - E_{+\delta} = \sqrt{2}\sqrt{1 + \cos(\pi - \delta)}\,\underline{E}_{+b} e^{-i(\pi-\delta)/2} \quad \text{Equation (7)}$$

$$E_{+t} = E_+ - E_{+b}$$

Hence:

$$\phi_+ = \phi_{+b} - \phi_{+t} = \arg\left(\frac{E_{+b}}{|E_{+b}|}\left[\frac{E_{+t}}{|E_{+t}|}\right]^{-1}\right) \quad \text{Equation (8)}$$

$$= \arg\left(\frac{\operatorname{sgn}[E_{+b}]}{\operatorname{sgn}[E_{+t}]}\right)$$

These steps can then be repeated for the -1 diffraction order to determine $\phi_-$. The overlay induced phase shift $\phi_{OV}$ can be calculated from:

$$2\phi_{OV} = \phi_+ - \phi_- \quad \text{Equation (9)}$$

Therefore, for a bias induced phase shift $\phi_\delta = 2\pi\delta$ (where the $\delta$ term is normalized with respect to the grating pitch) and substituting the above, the overlay induced phase shift $\phi_{OV}$ can be calculated according to the following formula:

$$e^{-i2\phi_{OV}} = \frac{e^{-i\phi_\delta}\operatorname{sgn}(E_- - e^{-i\phi_\delta}E_{-\delta})\operatorname{sgn}(E_+ - E_{+\delta})}{\operatorname{sgn}([E_- - E_{-\delta}][e^{-i\phi_\delta}E_+ - E_{+\delta}])} \quad \text{Equation (10)}$$

where the sign of a complex number z is defined by $\operatorname{sgn}(z) = z/|z|$, and as such has the effect of ensuring that the relative phase between the plus and minus orders is not required.

The calculation can be simplified if an optimized bias $\delta$ is chosen, comprising half the grating pitch p (i.e., $\delta = p/2$). In which case the equation becomes:

$$e^{-i2\phi_{OV}} = \frac{\operatorname{sgn}(E_- + E_{-\delta})\operatorname{sgn}(E_+ - E_{+\delta})}{\operatorname{sgn}([E_- - E_{-\delta}][-E_+ - E_{+\delta}])} \quad \text{Equation (11)}$$

It will be appreciated that for this partial coherent embodiment, the contrast in the measured images (i.e., on the detector) will be lower than for the fully coherent embodiment. However, the same phase information will be retrieved (or directly measured if using holography). Hence the equations relating to the partially coherent and fully coherent embodiments are the same, except for the normalization aspect for the loss in contrast.

In all cases, the actual overlay OV can be calculated from the overlay induced phase shift $\phi_{OV}$ according to the following equation:

$$OV = \frac{\phi_{OV}}{2\pi} \quad \text{Equation (12)}$$

This overlay may be retrieved modulo the target grating pitch p, as per current DBO methods; e.g., $$OV = \frac{\phi_{OV}}{2\pi}p \quad \text{Equation (13)}$$

The above equations consider only first order scattering, resulting in a linear relationship between the overlay induced phase shift $\phi_{OV}$ and the resulting overlay OV. However, it is acknowledged that near field effects and/or higher order diffraction effects might add a non-linearity to this relationship, although this non-linearity is expected to be very small and therefore can be ignored (or alternatively corrected for). It will be appreciated that optimizing the bias as described (δ=p/2), reduces the impact of this non-linearity. Additionally, such a bias should improve the signal to noise ratio.

Any method for measuring or extracting the required relative (or absolute) phases may be used in the above methods. A few example measurement schemes will now be described, by way of example. In each case, spatially (partial) coherent illumination should be used.

Figure 9:
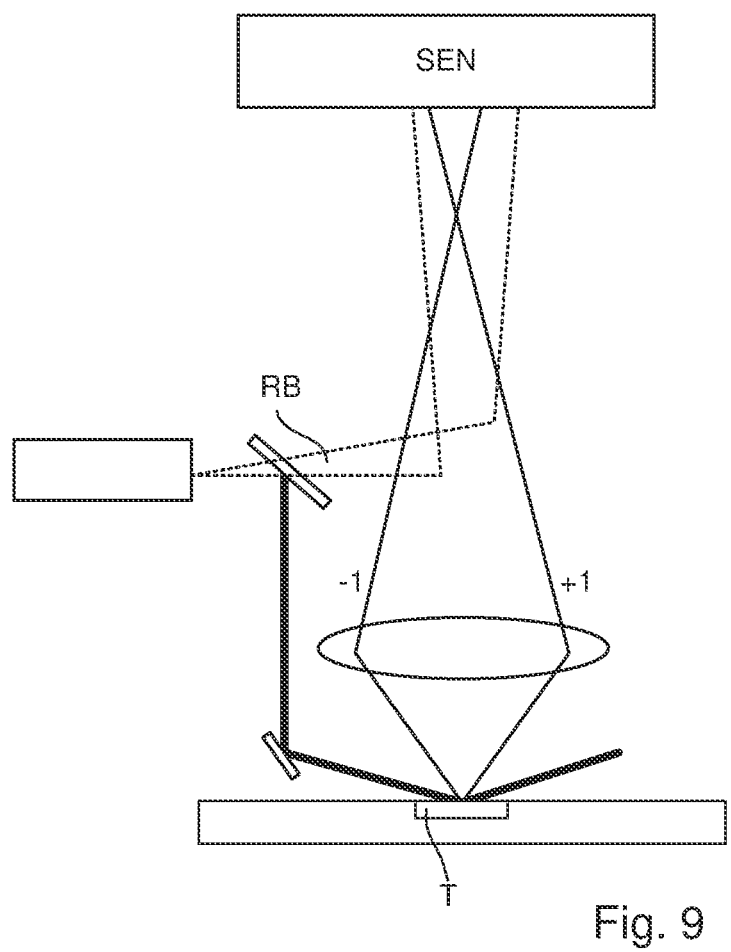
FIG. 9 illustrates an alternative inspection apparatus to that illustrated in FIG. 5, according to an embodiment of the invention.

FIG. 9 schematically illustrates a digital holographic microscopy arrangement. A known reference field (e.g., from a reference laser beam RB) is combined coherently on the sensor SEN (e.g., CCD or CMOS) with the object field from diffraction orders +1, −1 (diffracted from target T). The measured intensity from the combined fields (e.g., from additional fringes on the sensor) is decomposed into the reference and object field, e.g., using a suitable computer algorithm. This naturally provides the intensity and phase of the object field, from which the phase relation between the diffraction orders from both gratings is obtained. Digital holographic microscopy allows phase to be determined from a single measurement without any prior target knowledge, and even enables absolute phase measurements to be made.

In an alternative embodiment, a computational imaging/phase retrieval approach may be employed. In such an approach, the amplitude and phase of the target is retrieved from one or multiple intensity measurements of the target. The phase retrieval may use prior information of the metrology target (e.g., for inclusion in a loss function that forms the starting point to derive/design the phase retrieval algorithm). Alternatively, or in combination with the prior information approach, diversity measurements may be made. To achieve diversity, the imaging system is slightly altered between the measurements. An example of a diversity measurement is through-focus stepping, i.e., by obtaining measurements at different focus positions. Alternative methods for introducing diversity include, for example, using different illumination wavelengths or a different wavelength range, modulating the illumination, or changing the angle of incidence of the illumination on the target between measurements.

The phase retrieval arrangement is required to determine the relative phase between the two targets. In general, phase retrieval does not necessarily guarantee this. For example, this is not typically possible from only a single measurement at best focus, because there is insufficient information. Sufficient information can be obtained when the fields emitted by both targets interfere; however when in-focus, diffraction orders from each target tend to be narrow and therefore do not interfere with diffraction orders from the other target. As such, out-of-focus measurements are proposed. The required out-of-focus distance is set by the spacing between both gratings. In an embodiment, the out-of-focus distance can be reduced by:

Reducing the distance between the targets to ensure direct interference of the corresponding fields (i.e., relating to like higher diffraction orders, such that the +1 diffraction order from the first target interferes with the +1 diffraction order from the second target and similarly for the −1 diffraction orders). For example, such that the distance between the targets is not large with respect to the spatial coherence length of the point spread function for each target;

Adding one additional structure (e.g. a single grating) next to both the targets that generate an intermediate (reference) field which interferes with the diffracted fields from both targets; or Adding two or more additional structures (e.g. in each case a single grating) in the neighborhood of each of the targets which generate intermediate (reference) fields, such that each of the fields from each target undergoes interference with a diffracted field from a corresponding additional structure.

The description up to now has concentrated on determination of overlay, i.e., relative alignment of different layers. The principles described herein can also be used to determine a placement error of a single structure or target. When printing gratings with the lithographic apparatus, the exact printing location of a grating may deviate from a desired position. Or else, there may be an undesired relative position offset between two gratings exposed in the same layer. This can be due to lens aberrations in the imaging lens of the lithographic apparatus. The deviations are typically dependent on the location on the reticle and/or on the grating pitch and/or on wafer processing variations. Another application where it may be desirable to monitor relative positions of gratings in the same layer is if (for example) when the two gratings are printed in different lithography steps, but within the same layer. This may be the case, for example, in certain multiple patterning processes such as in a LELE (Litho-Etch-Litho-Etch) process. Another example is for monitoring alignment of stitched dies. Depending on the largest area which can be exposed in a single exposure of a lithographic apparatus (the maximum scanning field area), it may be that a single circuit/device layer is exposed in two (or more) exposures stitched together (a stitched die). To measure the alignment of the two sub-fields of a stitched die, a stitched grating pair or stitched target may be formed, which may comprise a first grating on a first sub-field (e.g., patterned from a first reticle) and a second (complementary) grating on a second sub-field (e.g., patterned from a second reticle). The relative positioning of the complementary patterns can then be measured to provide a measure of the relative positioning of the two sub-fields (the "stitched overlay").

A method for measuring (local) placement errors using a phase sensitive measurement will now be described. The method comprises performing a phase measurement of two targets, each comprising a single grating (e.g., in a single layer) and determining a relative displacement from a displacement induced phase difference between the two gratings (e.g., assuming illumination with a known illumination angle). The method may determine/extract phase information using any of the methods described herein. A single target embodiment will also be described.

Consider two targets (e.g., single grating targets) that are placed sufficiently close to each other. In this example, sufficiently close may be such that the distance between the targets is not large with respect to the spatial coherence length of the point spread function for each target (one or more intervening structures may be used if not sufficiently close, as already described). An image of the two targets can be measured, including phase information for the whole image. For example, the image may be a dark-field image, such that individual grating lines are not resolved. The phase difference between at least one higher diffraction orders from a first of the two targets and at least one higher diffraction orders from a second of the two targets contains information about the distance between the gratings. The first grating acts as a reference for the position of the second grating. This is similar in concept to a measurement using a digital interferometer.

The two gratings can have different pitches $p_1$, $p_2$ and different grating orders $m_1$, $m_2$ can be used. The displacement $D_1-D_2$ (modulo the effective grating pitches) can be found from the displacement induced phase difference $\phi_1-\phi_2$. More specifically, the displacement can be found by the following:

$$\left(D_1 \bmod \frac{p_1}{m_1}\right) - \left(D_2 \bmod \frac{p_2}{m_2}\right) = \left(\frac{p_1}{m_1}\frac{1}{2\pi}\phi_1\right) - \left(\frac{p_2}{m_2}\frac{1}{2\pi}\phi_2\right) \quad \text{Equation (14)}$$

Note that any programmed offset between the targets will add a "programmed" displacement term to this equation.

In an embodiment, a placement error variation metric can be determined which describes the placement error variation between the two locations (e.g., where the first location is the location of the first grating and the second location is the location of the second grating). This may comprise computing a placement error variation metric for the phase difference $\phi_1-\phi_2$, or more specifically, the difference $$\left(\frac{p_1}{m_1}\frac{1}{2\pi}\phi_1\right) - \left(\frac{p_2}{m_2}\frac{1}{2\pi}\phi_2\right).$$

The placement error variation metric may comprise a standard deviation, or standard deviation based metric. In an embodiment, a suitable standard deviation based metric may comprise using a MAD (Median Absolute Deviation) estimator or MAD metric. MAD is related to the standard deviation, but is significantly more robust (i.e., it can tolerate up to 50% outliers).

Note that the computation of a placement error variation metric should take into account potential problems due to the modulo $2\pi$ behavior. This can be thought of in terms of not knowing exactly where the origin of the grating(s) are, with respect to the optical axis of the sensor. To account for the modulo $2\pi$ behavior, it is proposed (for example) to introduce arbitrary $2\pi$ phase shifts at pixel level, such that the resulting standard deviation (or other variation metric) is minimized.

A single target (grating) embodiment may be based on the fact that, within a single target, a constant phase $\phi$ as a function of the location within that single target would be expected. This ignores the edge regions as a phase variation would be expected there due to target diffraction effects, for example. The variation of the phase $\phi$ can be determined by a placement error variation metric such as a standard deviation based metric (e.g., MAD estimator as described). This placement error variation metric can serve as a KPI for the placement error within the single target area.

The phase retrieval itself may be based on aforementioned patent application EP17199764. This describes determining from an intensity measurement, a corresponding phase retrieval such that interaction of the target and the illumination radiation is described in terms of its electric field (amplitude and phase). The intensity measurement may be of lower quality than that used in conventional metrology, and therefore may be out-of-focus as described. The described interaction may comprise a representation of the electric and/or magnetic field immediately above the target. In such an embodiment, the illuminated target electric and/or magnetic field image is modelled as an equivalent source description by means of infinitesimal electric and/or magnetic current dipoles on a (e.g., two-dimensional) surface in a plane parallel with the target. Such a plane may, for example be a plane immediately above the target, e.g., a plane which is in focus according to the Rayleigh criterion, although the location of the model plane is not critical: once amplitude and phase at one plane are known, they can be computationally propagated to any other plane (in focus, out of focus, or even the pupil plane). Alternatively, the description may comprise a complex transmission of the target or a two-dimensional equivalent thereof.

The phase retrieval may comprise modeling the effect of interaction between the illumination radiation and the target on the diffracted radiation to obtain a modelled intensity pattern; and optimizing the phase and amplitude of the electric field within the model so as to minimize the difference between the modelled intensity pattern and the detected intensity pattern. More specifically, during a measurement acquisition, an image (e.g., of a target) is captured on detector and its intensity measured. A phase retrieval algorithm is used to determine the amplitude and phase of the electric field at a plane parallel with the target (e.g., immediately above the target). The phase retrieval algorithm uses a forward model of an ideal sensor (e.g., aberrations and coherence), to reimage the target to obtain modelled values for intensity and phase of the field at the plane of detector. No target model is required. The difference between the modelled intensity values and detected intensity values is minimized in terms of phase and amplitude (e.g., iteratively) and the resultant corresponding modelled phase value is deemed to be the retrieved phase.

The required information for retrieving the phase may come from the diversity (multiple diverse measurements or images). Alternatively, or in combination, prior (target) knowledge may be used to constrain the phase retrieval algorithm. The prior knowledge, for example, may be included in a loss function that forms the starting point to derive/design the phase retrieval algorithm. In such an embodiment, the prior knowledge may be based on certain observations; for example there is much regularity between each image of the multiple images of the target. The multiple images may be obtained in a single measurement (e.g., a measurement using more than one illumination condition. e.g., a multi-wavelength measurement) or from the diversity measurements (different focus levels etc.) already described. It can be observed that, for each image, the target comprises a flat structure, having essentially a similar form. In particular, each obtained target image has the same or a very similar position and shape for each region of interest. For example, where the target is a x and y direction compound target, having a general form of a presently used DBO target, each image will generally comprise a region of relatively high intensity having a relatively flat intensity profile corresponding to the position of each target making up the compound target (e.g., a relatively flat intensity profile in each quadrant of a larger square pattern). This similarity between images may be exploited, for example, by means of a generalization of a Total Variation or Vector Total Variation regularization (i.e., imposing an LI penalty on the gradient of the target image). A benefit of this vector generalization is that it introduces a coupling between e.g., different illumination conditions.

It should be clear that diversity, prior target knowledge or both may be used in the phase retrieval. With sufficient diversity, it should not be necessary to impose a constraint based on prior target knowledge to ensure convergence. Equally, by constraining the phase retrieval algorithm using prior target knowledge, diversity (e.g., measurement at different levels of defocus) should not be necessary. Greater accuracy or better guarantee of convergence may be obtained by using both diversity and imposing a prior target knowledge constraint. The metrology apparatus for performing such a method may, for example, take the form of that illustrated in FIG. 5(a). However, this is purely illustrative and any suitable scatterometry based metrology device may be used.

While the above examples are described in terms of overlay, the invention is equally applicable to any metrology based on measuring asymmetry in a structure such as a target. While overlay is one example of a characteristic of interest which can be measured in this way, other examples may comprise focus and/or dose. These can be measured, for example, from targets which are exposed with a focus or dose dependent asymmetry which can be measured back and the exposure focus position and/or dose determined therefrom. Another example of a characteristic of interest for which the concepts herein are applicable is EPE (Edge Placement Error), which is a more complex form of overlay (e.g., a combination of overlay and critical dimension uniformity).

In a further embodiment, a novel performance metric or key performance indicator (KPI) is proposed which can be used as an absolute performance metric. Presently, typical intensity (only) asymmetry based overlay has no absolute reference, as the true overlay is unknown. Consequently, performance evaluation is obtained from a relative KPI based on (for example) overlay measurements of a target measured using different illumination characteristics (wavelengths etc.). The same issue arises with the methods described in the aforementioned document EP17199764, which provides for measurement of amplitude and phase from a target. Only after extracting an overlay value from this amplitude and phase image, and comparing this extracted overlay value with an overlay value determined using another wavelength (for example), can the measurement performance be evaluated.

The basic concept behind the KPI proposed in this embodiment is to numerically determine the bias δ (i.e., the bias induced phase shift $\phi_\delta$) and compare this to the intended bias δ or intended bias induced phase shift $\phi_\delta$. The closer that these values match, the better the measurement performance, assuming no manufacturing errors (e.g., process variations or similar). In this embodiment, the terms bias induced phase shift and target bias will be used interchangeably as they differ only by a factor of 2π divided by the period of the target grating.

Considering again the partly coherent embodiment, an analogous derivation to that of Equation (11) will be provided, but one which explicitly accounts for a possible sensor transmission offset $\phi_{sensor}$ between the measurements of the positive and negative diffraction orders, which may be complex. Separate measurement of $\underline{E}_+$ and $\underline{E}_{+\delta}$ respective of $\underline{E}_-$ and $\underline{E}_{-\delta}$ will yield:

$$\underline{E}_+ = E_b e^{i\phi_{stack}} + E_t e^{i\phi_{OV}} \qquad \text{Equation (15)}$$

$$\underline{E}_- e^{i\phi_{sensor}} = E_b e^{i\phi_{stack}} + E_t e^{-i\phi_{OV}} \qquad \text{Equation (16)}$$

$$\underline{E}_{+\delta} = E_b e^{i\phi_{stack}} + E_t e^{-i(\phi_{OV}+\phi_\delta)} \qquad \text{Equation (17)}$$

$$\underline{E}_{-\delta} e^{i\phi_{sensor}} = E_b e^{i\phi_{stack}} + E_t e^{-i\phi_{OV}+\phi_\delta)} \qquad \text{Equation (18)}$$

where the pitch of the two target gratings corresponds with a phase of 2π.

In Equations (15)-(18), fields $\underline{E}_+$, $\underline{E}_{+\delta}$, $\underline{E}_-$ and $\underline{E}_{-\delta}$ are known/measured, the bias induced phase shift $\phi_\delta$ is also known (although it will be assumed unknown and derived mathematically as a KPI in this embodiment), and the remaining parameters are unknown. This results in eight (real valued) equations and eight unknowns, which can be solved for overlay OV as already described; e.g., $$\phi_{OV} = \frac{1}{2}\arg\left(\frac{(E_- e^{-i\phi_\delta} - E_{-\delta})(E_+ - E_{+\delta})}{(E_+ e^{i\phi_\delta} - E_{+\delta})(E_- - E_{-\delta})}\right) \qquad \text{Equation (19)}$$

which is analogous to Equation (10).

To derive the KPI, it is proposed in this embodiment to solve Equations (14)-(17) for an unknown target bias induced phase shift $\phi_\delta$ (i.e., the known deliberate target bias δ is assumed unknown). The result is the following pair of equations:

$$\begin{cases} E_+(E_- - E_{-\delta})(e^{i\phi_{OV}} e^{i\phi_\delta} - e^{-i\phi_{OV}} e^{-i\phi_\delta}) \\ + E_-(E_+ - E_{+\delta})(e^{-i\phi_{OV}} - e^{-3i\phi_{OV}} e^{-2i\phi_\delta}) \\ + E_{+\delta}(E_- - E_{-\delta})(e^{-i\phi_{OV}} - e^{i\phi_{OV}}) \\ + E_{-\delta}(E_+ - E_{+\delta})(e^{-3i\phi_{OV}} e^{-i\phi_\delta} - e^{-i\phi_{OV}} e^{-i\phi_\delta}) = 0 \\ \phi_{OV} = \frac{1}{2}\arg\left(\frac{(E_- e^{-i\phi_\delta} - E_{-\delta})(E_+ - E_{+\delta})}{(E_+ e^{i\phi_\delta} - E_{+\delta})(E_- - E_{-\delta})}\right) \end{cases} \quad \text{Equations (20)}$$

the second of these equations being Equation (19). Equivalent pairs of equations can be derived in a similar manner for the fully coherent measurement embodiment (Equation (6)) and absolute coherent measurement embodiment (Equation (4) or (5)).

It is proposed to solve the pairs of Equations (20) for the unknown target bias $\phi_\delta$ by means of numerical root finding on these two equations, so to seek the value of the unknown target bias for which the left hand side of the first equation is indeed zero.

FIG. 10(a) shows a plot of the value for the left hand side of the first equation of Equations (19), as a function of the unknown target bias $\phi_\delta$, with the real part shown as a solid line and imaginary part as a dotted line. The plot shows multiple roots; the roots at 0 and a can be discarded, as these are trivial uninteresting solutions of the above two equations. FIG. 10(b) is a zoomed in detail of part of FIG. 10(a). This shows three roots, of which the root that is closest or equal to the known deliberate bias is assumed to be correct. In this specific example, therefore, the known target bias is 0.10 rad and therefore the root which can be observed at or around 0.10 rad on the Figure is the correct one. Note that the other two roots both lie close to 0.47 rad.

Therefore, by mathematically determining the target bias $\phi_\delta$ in this manner as if it was unknown, a KPI is derived which can be compared to the known deliberate target bias 2πδ, so as to evaluate measurement performance. This results in a KPI for assessing measurement performance, based on knowledge of the diffracted intensities and phases of the targets. The KPI can be used directly (i.e. without the need to compare it with measurement using different wavelengths for example) on the generated amplitude and phase image of an overlay target (e.g., generated by Computational Imaging). This is beneficial as it can be used, for example, to compare different Computational Imaging component settings (e.g. optics calibration strategy settings and/or phase retrieval algorithm settings) for their performance. This KPI can also be used in metrology qualification for evaluating different measurement recipes (e.g., combinations of target characteristics and illumination characteristics). For example, the KPI may be used as an absolute reference to augment the wavelength selection in such a metrology qualification step. More specifically, it may be that such a method comprises considering only those illumination characteristics (e.g., wavelengths) for which the estimated target bias (KPI) is sufficiently matched (e.g., within a threshold) to the known preprogrammed target bias.

Figure 11:
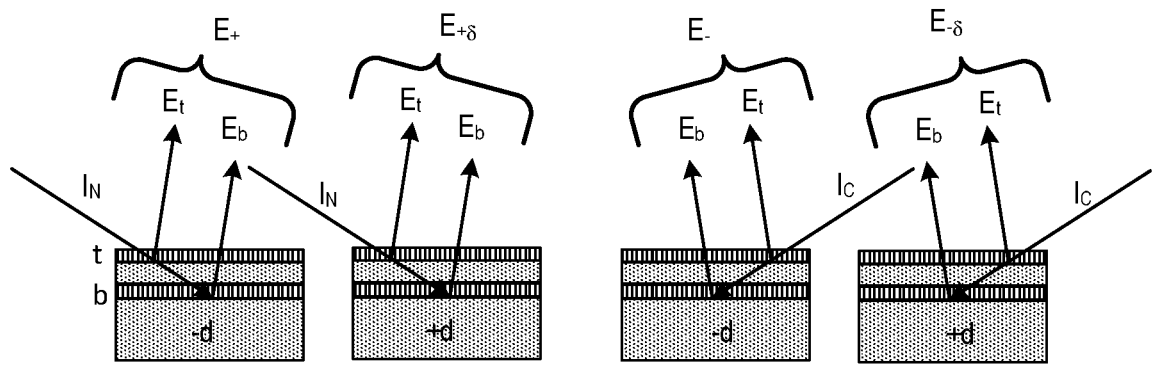
FIG. 11 illustrates a simple diffraction model of a DBO target having a top grating and a bottom grating.

Some additional embodiments using the concepts described herein will now be disclosed based on the simple model of illumination and target illustrated in FIG. 11. This shows a simple diffraction model of a DBO target having a top grating t and a bottom grating b. The description will refer to a single overlay target designed to measure in one direction (X or Y); extension to full X+Y overlay targets is straightforward. This single overlay target in the following discussion comprises two sub-targets, a first sub-target having a negative bias −d, and a second sub-target having a positive bias +d. This is in contrast to the one biased target and one unbiased target described previously; the principle is the same in each case, only minor details of the mathematical description varies.

The target is exposed in two modes: normal illumination IN and complementary illumination IC. In normal illumination mode, the +1st orders, diffracted by top and bottom grating, are detected together by the metrology tool, in complementary illumination mode the −1st orders combined are detected. The two illumination modes can be obtained via two different measurement modes: Wafer Rotation (WR—e.g. between 0 degrees—WR0 and 180 degrees WR180) or Complementary Aperture (CA). Based on these measurement modes the system behavior is defined for determining Overlay OV and tool induced shift TIS according to:

|  | OV | TIS |
| --- | --- | --- |
| WR | Fixed illumination aperture<br>Rotate wafer (WR0 and WR180)<br>OV per aperture | Fixed wafer rotation (e.g. WR0)<br>Switch illumination aperture<br>TIS per wafer rotation |
| CA | Fixed wafer rotation (e.g. WR0)<br>Switch illumination aperture<br>OV per wafer rotation | Fixed illumination aperture<br>Rotate wafer (WR0 and WR180)<br>TIS per aperture |

When a system is suffering from aberrations, it may be preferred best to perform the overlay measurement in WR-mode. This fixes the optical paths through the optics and reduces the impact of aberrations, and also enables better separation of tool induced asymmetries from target induced asymmetries in the signals. Typically, switching aperture is much faster than rotating the wafer, with a consequent throughput benefit in measuring overlay in CA-mode.

The measured fields can be expressed in terms of the diffracted fields at top and bottom layer, the phase lag between those fields, and the unknown common phase:

$$E_+ e^{i\varphi_+} = E_b e^{i\phi_{stack}} + E_t e^{i(\varphi_{OV} - \varphi_\delta)} \quad \text{Equation (21)}$$

$$E_- e^{i\varphi_-} = E_b e^{i\phi_{stack}} + E_t e^{-i(\varphi_{OV} - \varphi_\delta)} \quad \text{Equation (22)}$$

$$E_{+\delta} e^{i\varphi_+} = E_b e^{i\phi_{stack}} + E_t e^{i(\varphi_{OV} + \varphi_\delta)} \quad \text{Equation (23)}$$

$$E_{-\delta} e^{i\varphi_-} = E_b e^{i\phi_{stack}} + E_t e^{-i(\varphi_{OV} + \varphi_\delta)} \quad \text{Equation (24)}$$

and where the phase terms $\phi_\delta$ and $\phi_{OV}$ are determined by the bias applied and the OV, relative to the pitch P:

$$\varphi_\delta = \frac{\delta}{2\pi P} \quad \text{Equation (25)}$$

$$\varphi_{OV} = \frac{OV}{2\pi P} \quad \text{Equation (26)}$$

Note that the notation differs slightly from that used above, to emphasize the unknown common phase, and clarify the number of unknowns. For example, under this notation, The expression for overlay, equivalent to Equation (19), is as follows:

$$\varphi_{ov} = \frac{1}{2} \arg\left( \frac{E_- \, e^{-i\varphi_\delta} - E_{-\delta} \, e^{i\varphi_\delta}}{E_+ \, e^{i\varphi_\delta} - E_{+\delta} \, e^{-i\varphi_\delta}} \cdot \frac{E_+ - E_{+\delta}}{E_- - E_{-\delta}} \right) \quad \text{Equation (27)}$$

As can be seen, these relations give eight independent equations (two per measured complex field), whereas there are six unknowns and one parameter that is known by design. As has already been described, these relations can be used to derive overlay from the measured fields, even where traditional DBO has zero stack sensitivity.

It is further proposed that the sensitivity of the measured overlay to errors in the measured fields can be determined. This can be used to predict precision of the measured overlay, and hence as quality KPI that has direct relevance to a particular application.

Starting from the Equation (27), the sensitivity to errors in each of the measured fields can be derived. More specifically, when writing the error in the measured field $E_-$ as relative errors in the amplitude and phase: $dE_- = (\varepsilon_-(|E|) + i\varepsilon_-(\varphi))E_-$, the following equations for the sensitivity to measurement errors in $E_-$ can be derived:

$$\frac{\partial \varphi_{ov}}{\partial \varepsilon_{|E|}} = \text{Re}\left( \frac{1}{4\sin \varphi_\delta} \cdot \frac{\left( \frac{e^{-i(\varphi_\delta + \varphi_{stack})}}{E_b} + \frac{e^{i\varphi_{OV}}}{E_t} \right)}{(E_b e^{i\varphi_{stack}} + E_t e^{-i(\varphi_{OV} - \varphi_\delta)})} \right) \quad \text{Equations (28)}$$

and $$\frac{\partial \varphi_{ov}}{\partial \varepsilon_\varphi} = -\text{Im}\left( \frac{1}{4\sin \varphi_\delta} \cdot \frac{\left( \frac{e^{-i(\varphi_\delta + \varphi_{stack})}}{E_b} + \frac{e^{i\varphi_{OV}}}{E_t} \right)}{(E_b e^{i\varphi_{stack}} + E_t e^{-i(\varphi_{OV} - \varphi_\delta)})} \right)$$

Similarly the sensitivity to errors in one of the other measured components can be derived. Depending on the source of the measurement errors (noise or systematics) the sensitivity can be added e.g., in root-mean-square (RMS) or linear form. The RMS sensitivity to measurement noise in the field amplitude or field phase can be shown to be a function of the stack phase retardation $\varphi_{stack}$. It should be noted that the sensitivity equations above will change if another OV retrieval algorithm is used (see below), but the idea still remains valid.

The methods described up to now are based upon an analytical solution for overlay (e.g., Equation (19)/(27)), which is perfect for the ideal, error-free case. In the presence of measurement errors, or target imperfections (defects, process deformation, grating imbalance) this solution is not necessarily optimal. For example, for a value of $\varphi_{stack}$ of 20 degrees, the phase-resolved method based on the analytical expression has a higher sensitivity to amplitude errors than an intensity-only based DBO measurement, whereas the inclusion of the phase as additional information should enable a lower sensitivity to be achieved.

Instead of using the analytical expression, a more robust OV estimator can be obtained, by using the Equations (21)-(24) as a model for the measured signals, and finding the values that minimize the difference between measured and modeled complex fields. A possible implementation of this idea is the use of a maximum likelihood estimator. Weighing can be applied in the cost function used in such a minimization, to suppress sensitivity to certain error sources, such as one or more of (in any combination):

- higher noise in the phase of the measured electric fields than in the amplitude;
- impact of systematic sensor errors (sensor asymmetry) on the measured fields;
- impact of process errors, that are known to occur more frequently on the measured fields;
- impact of correlations in the noise of the measured components, such as correlation between the intensity asymmetry and electric field asymmetry.

Selecting the optimal approach for extracting overlay from the full electric fields can also be based on the value of $\varphi_{stack}$; it can be shown that the sensitivities for the various methods strongly depend on this parameter.

A KPI has already been described which is based on the consistency between calculated and known $\varphi_\delta$ (i.e. a pre-programmed overlay bias based KPI). In addition to this, the full set of Equations (21)-(24) also allows the parameters $E_b$, $E_t$, and $\varphi_{stack}$ to be solved:

$$E_b = \frac{1}{2}|E_+ e^{i\varphi_\delta} - E_{+\delta} e^{-i\varphi_\delta}|$$

$$E_t = \frac{1}{2\sin\varphi_\delta}|E_+ - E_{+\delta}|$$

$$\varphi_{stack} = \frac{1}{2}\arg\left(\frac{E_- \, e^{-i\varphi_\delta} - E_{-\delta} \, e^{i\varphi_\delta}}{E_- - E_{-\delta}} \cdot \frac{E_+ \, e^{i\varphi_\delta} - E_{+\delta} \, e^{-i\varphi_\delta}}{E_+ - E_{+\delta}}\right)$$

$$\underline{E}_{-\delta} e^{i\varphi_-} = \underline{E}_b e^{i\phi_{stack}} + \underline{E}_t e^{-i(\varphi_{OV}+\varphi_\delta)}$$

Equations (29)

As illustrated in FIG. 11, these parameters are dependent on the target and, more precisely, on the geometries and materials that make up the target. These, in turn, depend on manufacturing processing conditions. Therefore, these parameters may be used as consistency KPI's; monitoring these parameters, and flagging changes can be helpful in process monitoring. In high volume production, it is possible to set control limits, e.g., based on the minimum sensitivity to guarantee the quality of the measurements, or based on statistical analysis of the process variation.

In addition to using the surplus of information to derive these consistency KPI's, the following equations can additionally be derived, which hold for an ideal measurement (noise and error free) on an ideal target:

$$|E_+ - E_{+\delta}| = |E_- - E_{-\delta}|$$

and $$|E_+ e^{i\varphi\delta} - E_{+\delta} e^{-\varphi\delta}| = |E_- e^{i\varphi\delta} - E_{-\delta} e^{-i\varphi\delta}| \quad \text{Equations (30)}$$

Deviations from these equalities can be analyzed to find the root cause. Random variations, for instance, suggest measurement noise to be the issue, whereas systematic across-wafer fingerprints indicate processing effects which impact the positive and negative biased targets differently. Note, for instance, that the second of these equations describes the assumption that, for an ideal target, the +1st order and −1st order diffraction efficiency of the bottom grating is similar. If measurement tool asymmetry can be excluded (see below), than deviations from this equation may indicate bottom grating asymmetry.

In DBO, intensity differences between various signals are combined in different ways to further separate root causes of asymmetry. Note that, due to the unknown common phase terms, this method cannot be applied directly to the electric fields; however it may be useful to calculate and monitor other combinations of signals than the ones mentioned above.

It may be useful to analyze across wafer, wafer-to-wafer, and tool-to-tool variations of all of the parameters mentioned above, to better understand the occurrence and mechanisms of process variations. This may enable extraction of tool and process KPIs.

The methods are described above for an idealized uniform target pair. The concepts can also be used on a pixel pair basis, to determine within-target variations. For example, errors occur during wafer processing. Such processing errors are often apparent in overlay targets, which provides an opportunity to diagnose them. However, present image based metrology techniques provide insufficient information (i.e., only fringes in the intensity) to do this.

By using a phase-resolved overlay measurement, per-pixel (point-by-point) in the image, both the intensity and the phase of the wave emitted from the top grating can be retrieved. This allows:

- retrieval of topology of the top grating;
- per-pixel overlay measurement;
- topology info can be fed into a model of the stack.

More specifically, the optical path length of the light in the stack can be retrieved. This provides information regarding fabrication errors (stack thickness/refractive index changes). When the layer thickness and refractive index are known, this can even directly yield the topology of the top layer.

Based on the assumptions of the partially coherent measurement embodiment described above, formulas can be derived which express the optical path lengths in terms of the measured complex electric fields $\underline{E}_+$, $\underline{E}_{+\delta}$ and $\underline{E}_-$, $\underline{E}_{-\delta}$. The optical path length difference $\Delta$ OPL($r_i$, $r_j$) (modulo the wavelength $\lambda$, i.e., for optical path length differences smaller than one wavelength) between two locations on the wafer can be derived by:

$$\Delta \, OPL(r_i, r_j) = \frac{\lambda}{2\pi}\Delta\phi_{\{stack\}}(r_{\{i\}}, r_{\{j\}}) \quad \text{Equation (31)}$$

where, taking the argument or the imaginary part of the log (any real parts give a measure of the absorption in the stack or indicate a different diffraction intensity at both locations), $\Delta\phi_{\{stack\}}(r_{\{i\}}, r_{\{j\}})\{stack\}(r_{\{j\}}) - \phi_{\{stack\}}(r_{\{i\}})$ is given by:

$$\frac{E_b e^{i\,\phi_{stack}(r_i)}}{E_b e^{i\,\phi_{stack}(r_j)}} = e^{ii(\phi_{\{stack\}}(r_{\{i\}}) - \phi_{\{stack\}}(r_{\{i\}}))} \quad \text{Equation (32)}$$

and where:

$$E_{\{b\}}e^{\{i\phi_{\{stack\}}\}} = \frac{-E_{\{+\delta\}} + e^{\{i\phi_\delta^\delta\}}E_{\{+\}}}{-1 + e^{\{i\delta\}}} \quad \text{Equation (33)}$$

A further embodiment will now be described, where an asymmetry per order is determined for each of a number of acquisitions, where each acquisition may be performed at a different acquisition setting. The different acquisition settings may comprise, for example, different wavelengths, polarizations, focus settings, any other relevant parameter settings and/or different combinations of two or more of these parameters. The asymmetries from multiple acquisitions can then be combined.

When all acquisitions are combined by the phase retrieval algorithm into a single phase retrieval, as has been described till now, it can be a challenge to troubleshoot or optimize. For each calculation method (intensity, phase, etc.) a single overlay value is reported. The above-described concept can be limited by hardware in providing reliable phase-retrieval results within acquired images (diffraction angle, diffraction order). Between images there can be an arbitrary phase-offset.

By using multiple acquisitions as proposed in this embodiment, additional corrections can be applied for offsets and/or non-linearity Distribution analysis on these multiple acquisitions enables troubleshooting in measurement/acquisition settings and efficient recipe setup. Additionally, the multiple acquisition method could be used as a fallback, such as when the phase-retrieval algorithm is not fully understood over multiple acquisitions.

The asymmetry signal can no longer be calculated per bias-direction, since this requires taking the difference between +1 and −1 orders, and there is an arbitrary phase-offset between both orders. Therefore, it is proposed to calculate the asymmetry per order. As such, the overlay phase calculation for calculating the phase contribution due to overlay $\varphi_{ov}$ may be rewritten as:

$$\varphi_{ov} = \operatorname{Im} \ln \left( \frac{E_+ - E_{+\delta}}{E_+ \, e^{i\varphi_\delta} - E_{+\delta} \, e^{-i\varphi_\delta}} \cdot \frac{E_- \, e^{-i\varphi_\delta} - E_{-\delta} \, e^{i\varphi_\delta}}{E_- - E_{-\delta}} \right) = \quad \text{Equation (34)}$$

$$\operatorname{Im} \ln \left( \frac{A_+}{A_-} \right)$$

where $$A_+ = \frac{E_+ - E_{+\delta}}{E_+ \, e^{i\varphi_\delta} - E_{+\delta} \, e^{-i\varphi_\delta}}, \quad A_- = \frac{E_- - E_{-\delta}}{E_- \, e^{-i\varphi_\delta} - E_{-\delta} \, e^{i\varphi_\delta}}$$

The asymmetries $A_+$ and $A_-$ can be calculated for each acquisition setting (e.g., every wavelength and polarization state (or even focus level)). This creates a number of possibilities for multi-acquisition corrections, for example to correct for:

offset per asymmetry,
offset on $\varphi_{ov}$,
non-linearity,
as a function of $\varphi_{stack}$, etc.

As such, in this embodiment, intermediate results (i.e., one for each acquisition) may be reported (in terms of asymmetries $A_+$ and $A_-$ and/or other metrics (e.g., fit convergence, calculation time)) per acquisition setting. The characteristic of interest (e.g., overlay) can then be calculated from a combination of the intermediate results, with one or more additional correction for any offsets and dependencies.

For example, $\varphi_{ov}$ can be calculated as:

$$\varphi_{OV} = \operatorname{Im} \ln \left( \frac{A_+ + A_{0+}}{A_- + A_{0-}} \right) + \varphi_0 \quad \text{Equation (35)}$$

where:
$A_{0+}$ is an offset on $A_+$, $A_{0-}$ is an offset on $A_-$ and $\varphi_0$ is an offset on $\varphi_{ov}$.

The variables can be function of $\varphi_{stack}$, or any other variable which is independent of overlay and bias.

A statistical analysis may be performed on the intermediate results to estimate accuracy and robustness of the calculated characteristic of interest. Furthermore, a classification and fault detection may be performed on the statistical analysis to detect deviating measurement conditions and/or optical (sub-)components. A statistical analysis can also be performed on any intermediate results in terms of fit, so as to estimate fit quality for the characteristic of interest. An optimum measurement setting/recipe and fit context can be determined based on such statistical analyses.

More specifically, the statistical analysis might comprise determining which acquisitions contribute most to, or best fit, the phase retrieval step based on a distribution analysis, e.g. outlier detection, of the outcome of individual acquisitions. This information can be used for classification and performing fault-detection on the measurements. It is possible to detect deviating (out-of-spec) measurement conditions, and also deviating optical (sub-) components, e.g. part of a pupil. This could be used, for example, to trigger a maintenance action (e.g., recalibration, replacement of a hardware component etc.) or to avoid one or more specific conditions.

The distribution analysis performed on the multiple acquisitions can also be combined with a measure of the phase retrieval algorithm performance, e.g. convergence/calculation time. A trade-off can then be made between the acquisition/calculation time and overlay performance (accuracy/robustness). Such a trade-off can serve as a recipe-setup step for the phase-retrieval method.

Figure 12A:
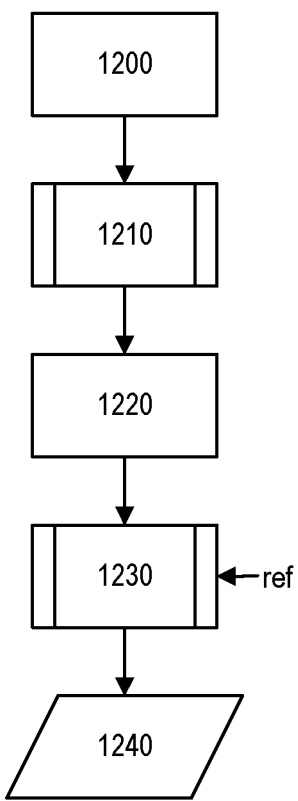
FIG. 12(a) is a flowchart describing present method for measurement recipe optimization.

The various KPIs and sensitivity analysis described above can also be used during recipe set up and optimization. Notice in this context that the use of phase information may also lead to another choice of the bias of the gratings, leading to another $\varphi_\delta$ to improve the OV retrieval robustness. A specific such embodiment may find utility, for example, on present metrology devices (e.g., those which use more complex optics with aberration kept to a minimum). FIG. 12(a) shows a typical process flow used presently for recipe set up and optimization (referred to as holistic metrology qualification (HMQ)). The method aims to find the optimum (single-/multi-wavelength) recipe based on subsequent sparse, then dense sampling of targets/locations at a plurality of illumination settings (wavelengths and other recipe settings, e.g. polarization, aperture).

At step 1200, a pre-selection method on a relatively low number of targets is performed, using the full wavelength spectrum available (or large number of wavelengths). For example, the number of targets measured at this step may be fewer than 20, more specifically between 5 and 15. The number of wavelengths may be (for example) between 30 and 50, or approximately 40. At sub-step 1210, the better performing subset of illumination characteristics (including e.g., between 10 and 20, or about 15 wavelengths) are selected for the optimizing step 1220. Optimization step 1220 comprises measuring a dense number of targets with the selected (e.g., about 15) wavelengths. For example, the number of targets may be more than 50, more than 70, more than 90 or about 100. The optimization comprises an evaluation sub-step 1230, where the measurements under the different illumination conditions are evaluated for accuracy and robustness. This evaluation step may use a reference ref for the actual overlay value. As the actual overlay value is not typically known, methods for determining a reference may be used. For example, a self-reference overlay value may be obtained using the $A_+$ versus $A_-$ analysis described in PCT patent application WO 2015/018625, which is incorporated herein in its entirety by reference. Such a method may comprise regressing through a plot of $A_+$ and $A_-$ for the different wavelengths, to obtain an overlay value for each target, and averaging these overlay values for all the targets to obtain a reference value. Other reference methods can be used. The result of this method is an optimized (single or multiple wavelength) recipe 1240. Typically this process flow takes about 1 hour to perform.

There are a number of drawbacks in this method flow. While the overlay reference described above shows reasonably good performance, it has the intrinsic limitation that the intensity-phase of the measured images is not known in regular acquisitions. This intensity-phase can contain valuable information about overlay.

Figure 12B:
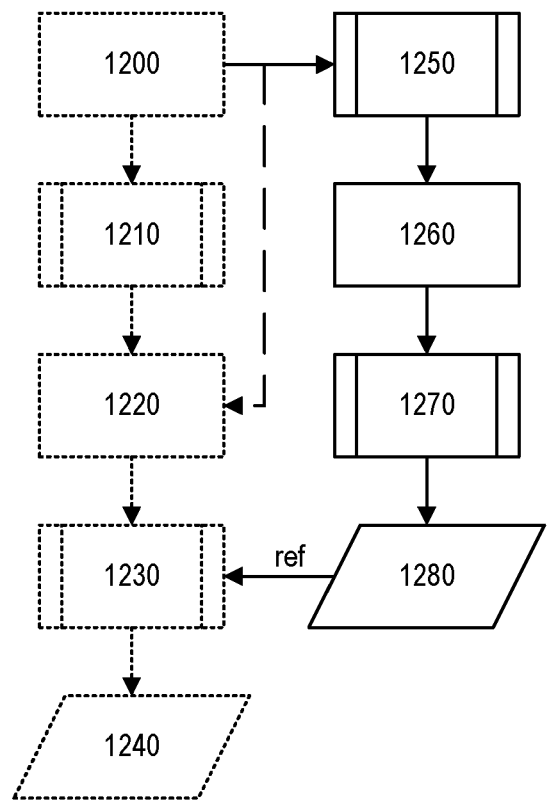
FIG. 12(b) is a flowchart describing an improved method for measurement recipe optimization according to an embodiment of the invention.

FIG. 12(*b*) shows the proposed method according to an embodiment. It is based around the original flow described above, and shown dotted. As such, it is proposed that the additional steps are performed in parallel with the HMQ flow of FIG. 12(*a*), so as to determine an improved overlay reference for the optimization 1220/evaluation 1230 steps. Where the steps are unchanged from that of FIG. 12(*a*), they will not be described.

The pre-selection step 1200 is altered slightly in that all pre-selection measurements are performed with diversity, more specifically at a plurality (e.g., between 3 and 5) focus levels. As before, this step is performed with a large (e.g., full-band) number of wavelengths on a relatively low number of targets.

At sub-step 1250, based on the results of these measurements, a sub-set of the measured targets and wavelengths/illumination settings (and optionally focus-levels, or else the measurements relating to the subset for all focus levels are used) is selected. For example, the sub-set may be based on 5 targets or fewer, at 10 wavelengths or fewer (e.g., between 5 to 10 wavelengths), for the 3-5 focus levels. At step 1260, the phase retrieval is performed to obtain the full field values for each of the targets. At step 1270, a focus correction is performed on the measurements which were performed out of focus. At step 1280, a reference overlay, and optionally any other KPIs, is calculated from the focus corrected measurements, based on the retrieved phase. Steps 1260-1280 may be performed using any suitable method disclosed herein. At the end of the optimization phase 1220, the output of the determined overlay (and/or the calculated full field) is used as reference for comparison with the measured data in the evaluation sub-step 1230. Due to the limited target-sampling, the phase retrieval output should be sufficient for an indication of accuracy. For robustness, other references (e.g., the earlier described self-reference) can still be used, e.g., to quantify the variation over the substrate. This concept is not limited to finding overlay references. Focus references, for example, in a DBF recipe optimization flow, could be determined in this manner.

The existing metrology device uses partially coherent radiation. Partial coherence phase retrieval could be performed, for example, by using a Sum of Coherent Systems. A possible downside of this approach might be that there are a multitude of systems to solve, which could impact the calculation time by factors up to 100× (although methods to reduce or eliminate this time impact are envisaged). To increase the speed of the phase retrieval calculation, the input parameters may be tuned; e.g., the number of wavelengths and focus levels (sparse sampling). Where present, the metrology device's on-board GPU may be used to perform the phase retrieval calculation. Also, the efficiency of the phase retrieval algorithm may also be improved. In this way, it is envisaged that the phase retrieval could be performed on a single (or few) targets within 30 minutes, fast enough to run in parallel with the existing HMQ method flow.

Therefore, in summary, a method for measuring a characteristic of interest is proposed, the method comprising determining the characteristic of interest relating to a structure directly from the effect of the characteristic of interest on the phase of radiation scattered by the structure. More specifically, the method comprises determining a characteristic of interest induced phase change contribution of the scattered radiation which results from the effect of the characteristic of interest on measurement radiation when said structure is illuminated and scattered by said structure to obtain said scattered radiation.

The methods described herein are not limited to DBO, they can be applied to all asymmetry measurement modes, such as DBF (diffraction based focus), and possibly also ARO (angle resolved overlay), provided that the electric field phase information is available.

Further embodiments are disclosed in the subsequent numbered clauses:

1. A method for measuring a characteristic of interest relating to a structure on a substrate comprising:
    calculating a value for the characteristic of interest directly from the effect of the characteristic of interest on at least the phase of illuminating radiation when scattered by the structure, subsequent to illuminating said structure with said illuminating radiation.

2. A method as defined in clause 1, comprising:
    determining a characteristic of interest induced phase change contribution of the scattered radiation, the characteristic of interest induced phase change contribution comprising the effect of the characteristic of interest on the phase of the illuminating radiation when scattered by said structure; and
    calculating the value for the characteristic of interest directly from at least the determined characteristic of interest induced phase change contribution.

3. A method as defined in clause 2, comprising determining said characteristic of interest induced phase change contribution from determination of amplitude and phase relating to the diffraction orders of a corresponding higher order pair of diffraction orders comprised within the radiation scattered by the structure.

4. A method as defined in clause 3, wherein said structure comprises at least a first sub-structure with a first known characteristic of interest bias, and a second sub-structure with either no characteristic of interest bias or a second known characteristic of interest bias different from the first known characteristic of interest bias, and the method comprises determining said characteristic of interest induced phase change contribution from comparisons of said diffraction orders comprised in said scattered radiation from each of the first sub-structure and second sub-structure.

5. A method as defined in clause 4, comprising determining said characteristic of interest induced phase change contribution from, at least:
a first relative phase of: a first positive higher order diffracted field relating to the first sub-structure and a second positive higher order diffracted field relating to the second sub-structure; and
a second relative phase of: a first negative higher order diffracted field relating to the first sub-structure and a second negative higher order diffracted field relating to the second sub-structure.

6. A method as defined in clause 5, wherein the first and second sub-structures each comprise pairs of grating, each grating having a pitch p, and wherein said first known characteristic of interest bias comprises p/2 and the second sub-structure has no characteristic of interest bias.

7. A method as defined in clause 5 or 6, wherein said characteristic of interest induced phase change contribution is further determined from:
a third relative phase of: the first positive higher order diffracted field and the second negative higher order diffracted field; and
a fourth relative phase of: the first negative higher order diffracted field and the second positive higher order diffracted field.

8. A method as defined in any of clauses 5 to 7 comprising calculating the value for the characteristic of interest by determining a model of each of said diffracted fields, and minimizing the difference between the model of the diffracted fields and the equivalent diffracted fields as measured.

9. A method as defined in clause 10, comprising applying a weighting to a cost function used in the minimization, which suppresses sensitivity to one or more error sources.

10. A method as defined in any of clauses 5 to 7, comprising performing a holographic microscopy measurement of said higher diffraction orders to obtain said relative phase information based on a known reference field.

11. A method as defined in any of clauses 5 to 7, comprising performing a phase retrieval determination from intensity measurements of said higher diffraction orders to obtain said relative phase information.

12. A method as defined in clause 11, wherein said first sub-structure and said second sub-structure are located in sufficient proximity to each other to ensure that the electric fields of like higher diffraction orders interfere before detection.

13. A method as defined in clause 11, wherein:
providing at least one additional structure on the substrate to generate at least intermediate field such that said at least one intermediate field interferes with the electric field of the higher diffraction orders diffracted from first sub-structure and said second sub-structure; or
providing at least one first additional structure on the substrate to generate at least one first intermediate field such that said at least one first intermediate field interferes with the electric field of the higher diffraction orders diffracted from said first sub-structure and providing at least one second additional structure on the substrate to generate at least one second intermediate field such that said at least one second intermediate field interferes with the electric field of the higher diffraction orders diffracted from said second sub-structure.

14. A method as defined in any of clauses 11 to 13, wherein said intensity measurements relate to measurements of said structure performed out of focus.

15. A method as defined in any of clauses 11 to 14, wherein said intensity measurements relate to measurements of said structure performed with a measurement setting varied.

16. A method as defined in clause 15, wherein said intensity measurements relate to measurements of said structure performed at different focus levels.

17. A method as defined in any of clauses 11 to 16, wherein said phase retrieval comprises:
modeling the effect of interaction between incident illuminating radiation and the structure on the scattered radiation to obtain modeled values for phase and amplitude at a detection plane; and optimizing the phase and amplitude of the electric field as modeled so as to minimize the difference between the modeled intensity and the intensity measurements as detected.

18. A method as defined in clause 17, comprising using prior knowledge of the structure as a constraint to the optimization of the phase and amplitude of the electric field.

19. A method as defined in clause 18, wherein said constraint comprises a total variation regularization.

20. A method as defined in any of clauses 5 to 19, comprising deriving a sensitivity to errors in each of said diffracted fields from the characteristic of interest induced phase change; and
using the derived sensitivity as a performance indicator relating to the method for measuring a characteristic of interest.

21. A method as defined in any of clauses 4 to 19, comprising:
determining a performance metric by calculating the first known characteristic of interest bias mathematically; and
comparing the performance metric to the first known characteristic of interest bias as designed, to evaluate performance of the method.

22. A method as defined in clause 21, wherein the step of determining a performance metric comprises:
solving, for the first known characteristic of interest bias, a system of equations describing the first positive higher order diffracted field, the first negative higher order diffracted field, the second positive higher order diffracted field, and the second negative higher order diffracted field.

23. A method as defined in clause 22, wherein the solving step comprises:
performing a root finding operation on said system of equations to find one or more roots; and
selecting, as the performance metric, the root having a value corresponding closest to the first known characteristic of interest bias as designed.

24. A method as defined in clause 23, wherein the step of performing a root finding operation comprises suppressing noise in the root finding.

25. A method as defined in any of clauses 5 to 24, further comprising routinely deriving values for one or both of the electric field relating to a top grating of said structure or one or more sub-structures thereof, the electric field relating to a top grating of said structure or one or more sub-structures thereof, and/or a stack induced phase change contribution of the scattered radiation; and monitoring for changes in these values.

26. A method as defined in any preceding clause, comprising calculating a reference value for the characteristic of interest from measurements of at least said structure at a plurality of different illumination settings and at a plurality of different focus settings; and using said reference value as a reference for the characteristic of interest in a measurement recipe optimization method.

27. A method as defined in clause 26, wherein said calculating a reference value for the characteristic of interest is performed in parallel to the measurement recipe optimization method.

28. A method as defined in any preceding clause, comprising determining intermediate measurement values relating to different acquisition settings.

29. A method as defined in clause 28 wherein the intermediate measurement values are combined with one or more offset corrections to determine said characteristic of interest.

30. A method as defined in clause 28 or 29, comprising performing a statistical analysis on the intermediate measurement values to determine a quality metric for said characteristic of interest and/or to detect intermediate conditions or optical components which are outside of specification.

31. A method as defined in any preceding clause, comprising determining per-pixel values of the characteristic of interest.

32. A method as defined in clause 31, comprising using said per-pixel values of the characteristic of interest to retrieve information describing a topology of a layer of the structure.

33. A method as defined in any preceding clause, wherein said characteristic of interest comprises overlay.

34. A method as defined in any of clauses 1 to 32, wherein said characteristic of interest comprises a placement error.

35. A method as defined in clause 34, wherein the placement error relates to relative placement between a first target and a second target in a layer.

36. A method as defined in clause 35, wherein the first target and second target are each formed in different patterning steps of a multiple patterning process.

37. A method as defined in clause 35, wherein the first target and second target are each formed in different exposures forming a stitched exposure.

38. A method as defined in clause 35, 36 or 37 wherein the first target and second target are subject to different lens aberration effects during their formation.

39. A method as defined in any of clauses 35 to 38, wherein the relative placement is determined from a displacement induced phase difference in measurements of the first target and second target.

40. A method as defined in clause 39, wherein said displacement induced phase difference comprises a phase difference in at least one higher diffraction order of radiation diffracted from said first target and second target.

41. A method as defined in clause 40, comprising determining a placement error variation metric describing the placement error variation between the corresponding locations of the first target and second target, based on the variation in said displacement induced phase difference.

42. A method as defined in any of clauses 35 to 41, wherein the relative placement is determined modulo the pitches of said first target and second target.

43. A method as defined in clause 34, wherein the placement error relates to placement of a single target.

44. A method as defined in clause 43, comprising determining a placement error variation metric describing the placement error variation for the single target, based on variation of phase within at least a region of the target.

45. A method as defined in clause 42 or 44, wherein the placement error variation metric is comprises a standard deviation based metric of the placement error.

46. A method as defined in clause 45, wherein the standard deviation based metric comprises a Median Absolute Deviation metric.

47. A non-transitory computer program product comprising machine-readable instructions for causing a processor to cause performance of the method as defined in any preceding clause.

48. An inspection apparatus operable to perform the method of any of clauses 1 to 46.

49. An inspection apparatus comprising:
a substrate holder for holding a substrate comprising a structure,
projection optics for projecting illuminating radiation onto the structure;
a detector for detecting said illuminating radiation subsequent to it having been scattered by the structure; and
a processor operable to calculate a value for a characteristic of interest relating to the structure directly from the effect of the characteristic of interest on at least the phase of illuminating radiation when scattered by the structure.

50. An inspection apparatus as defined in clause 49, wherein the processor is further operable to:
determine a characteristic of interest induced phase change contribution of the scattered radiation, the characteristic of interest induced phase change contribution comprising the effect of the characteristic of interest on the phase of the illuminating radiation when scattered by said structure; and calculate the value for the characteristic of interest directly from the determined characteristic of interest induced phase change contribution.

51. An inspection apparatus as defined in clause 50, wherein the processor is further operable to determine said characteristic of interest induced phase change contribution from determination of amplitude and phase relating to the diffraction orders of a corresponding higher order pair of diffraction orders comprised within the radiation scattered by the structure.

52. An inspection apparatus as defined in clause 51, wherein said structure comprises at least a first sub-structure with a first known characteristic of interest bias, and a second sub-structure with either no characteristic of interest bias or a second known characteristic of interest bias different from the first known characteristic of interest bias, and the processor is operable to determine said characteristic of interest induced at least phase change contribution from comparisons of said diffraction orders comprised in said scattered radiation from each of the first sub-structure and second sub-structure.

53. An inspection apparatus as defined in clause 52, wherein the processor is further operable to determine said characteristic of interest induced phase change contribution from, at least:
a first relative phase of: a first positive higher order diffracted field relating to the first sub-structure and a second positive higher order diffracted field relating to the second sub-structure; and
a second relative phase of: a first negative higher order diffracted field relating to the first sub-structure and a second negative higher order diffracted field relating to the second sub-structure.

54. An inspection apparatus as defined in clause 53, wherein the first and second sub-structures each comprise pairs of grating, each grating having a pitch p, and wherein said first known characteristic of interest bias comprises p/2 and the second sub-structure has no characteristic of interest bias.

55. An inspection apparatus as defined in clause 53 or 54, wherein the processor is further operable to determine said characteristic of interest induced phase change contribution from:
   a third relative phase of: the first positive higher order diffracted field and the second negative higher order diffracted field; and
   a fourth relative phase of: the first negative higher order diffracted field and the second positive higher order diffracted field.

56. An inspection apparatus as defined in any of clauses 53 to 55, being a holographic microscopy apparatus, comprising:
   a reference source for generating a known reference field;
   wherein said processor is operable to measure of said higher diffraction orders and obtain said relative phase information with respect to said known reference field.

57. An inspection apparatus as defined in any of clauses 53 to 55, being operable to:
   detect intensity measurements of said higher diffraction orders on said detector;
   wherein the processor is operable to perform a phase retrieval determination from said intensity measurements to obtain said relative phase information.

58. An inspection apparatus as defined in clause 57, being operable to perform said intensity measurements with said structure being out of focus.

59. An inspection apparatus as defined in clause 57 or 58, being operable to perform said intensity measurements with a measurement setting varied between measurements.

60. An inspection apparatus as defined in clause 59, being operable to perform said intensity measurements at different focus levels.

61. An inspection apparatus as defined in any of clauses 57 to 60, wherein processor is operable to perform said phase retrieval by:
   modeling the effect of interaction between incident illuminating radiation and the structure on the scattered radiation to obtain modeled values for phase and amplitude at a detection plane; and
   optimizing the phase and amplitude of the electric field as modeled so as to minimize the difference between the modeled intensity and the intensity measurements as detected on the detector.

62. An inspection apparatus as defined in clause 61, wherein the processor is further operable to use prior knowledge of the structure as a constraint to the optimization of the phase and amplitude of the electric field.

63. An inspection apparatus as defined in clause 62, wherein said constraint comprises a total variation regularization.

64. An inspection apparatus as defined in any of clauses 52 to 63 wherein the processor is further operable to:
   determine a performance metric by calculating the first known characteristic of interest bias mathematically; and
   compare the performance metric to the first known characteristic of interest bias as designed, to evaluate performance of the method.

65. An inspection apparatus as defined in clause 55, wherein the processor is operable to determine said performance metric by:
   solving, for the first known characteristic of interest bias, a system of equations describing the first positive higher order diffracted field, the first negative higher order diffracted field, the second positive higher order diffracted field, and the second negative higher order diffracted field.

66. An inspection apparatus as defined in clause 65, wherein the processor is operable to solve the system of equations by:
   performing a root finding operation on said system of equations to find one or more roots; and
   selecting, as the performance metric, the root having a value corresponding closest to the first known characteristic of interest bias as designed.

67. An inspection apparatus as defined in clause 66, wherein the processor is operable to suppress noise in the root finding operation.

68. An inspection apparatus as defined in any of clauses 49 to 66, wherein said characteristic of interest comprises overlay.

69. An inspection apparatus as defined in any of clauses 49 to 66, wherein said characteristic of interest comprises a placement error.

Although specific reference may be made in this text to the use of lithographic apparatus in the manufacture of ICs, it should be understood that the lithographic apparatus described herein may have other applications. Possible other applications include the manufacture of integrated optical systems, guidance and detection patterns for magnetic domain memories, flat-panel displays, liquid-crystal displays (LCDs), thin-film magnetic heads, etc.

Although specific reference may be made in this text to embodiments of the invention in the context of an inspection or metrology apparatus, embodiments of the invention may be used in other apparatus. Embodiments of the invention may form part of a mask inspection apparatus, a lithographic apparatus, or any apparatus that measures or processes an object such as a wafer (or other substrate) or mask (or other patterning device). The term "metrology apparatus" may also refer to an inspection apparatus or an inspection system. E.g. the inspection apparatus that comprises an embodiment of the invention may be used to detect defects of a substrate or defects of structures on a substrate. In such an embodiment, a characteristic of interest of the structure on the substrate may relate to defects in the structure, the absence of a specific part of the structure, or the presence of an unwanted structure on the substrate.

Although specific reference may have been made above to the use of embodiments of the invention in the context of optical lithography, it will be appreciated that the invention, where the context allows, is not limited to optical lithography and may be used in other applications, for example imprint lithography.

While the targets or target structures (more generally structures on a substrate) described above are metrology target structures specifically designed and formed for the purposes of measurement, in other embodiments, properties of interest may be measured on one or more structures which are functional parts of devices formed on the substrate. Many devices have regular, grating-like structures. The terms structure, target grating and target structure as used herein do not require that the structure has been provided specifically for the measurement being performed. Further, pitch P of the metrology targets may be close to the resolution limit of the optical system of the scatterometer or may be smaller, but may be much larger than the dimension of typical product features made by lithographic process in the target portions C. In practice the lines and/or spaces of the overlay gratings within the target structures may be made to include smaller structures similar in dimension to the product features.

While specific embodiments of the invention have been described above, it will be appreciated that the invention may be practiced otherwise than as described. The descriptions above are intended to be illustrative, not limiting. Thus it will be apparent to one skilled in the art that modifications may be made to the invention as described without departing from the scope of the claims set out below.

What is claimed is:

1. A method comprising:
illuminating a target structure on a substrate;
detecting radiation scattered by the target;
calculating a reference value for a characteristic of interest from measurements of the detected radiation scattered by the target at different focus settings;
adjusting a measurement recipe based on the reference value; and
using the adjusted measurement recipe in a subsequent process performed by a metrology or lithographic apparatus.

2. The method of claim 1, further comprising continuously adjusting the measurement recipe in response to updated reference value calculations.

3. The method of claim 1, further comprising:
determining a set of intermediate measurement values relating to different acquisition settings, the different acquisition settings corresponding to the different focus settings.

4. The method of claim 3, further comprising:
combining the intermediate values with one or more offset corrections to determine the characteristic of interest.

5. The method of claim 4, further comprising:
based on a statistical analysis of the intermediate measurement values,
determining a quality metric for the characteristic of interest; and
identifying intermediate conditions or optical components that are deemed as outliers.

6. The method of claim 1, further comprising:
determining a set of per-pixel values of the characteristic of interest.

7. The method of claim 6, further comprising:
generating information describing a topology of a layer of the structure based on the set of per-pixel values of the characteristic of interest.

8. The method of claim 1, wherein said characteristic of interest comprises overlay.

9. The method of claim 1, wherein said characteristic of interest comprises a placement error.

10. The method of claim 9, wherein the placement error relates to a relative placement between a first target and a second target in a layer.

11. The method of claim 10, wherein the first target and second target are each formed in different patterning steps of a multiple patterning process.

12. The method of claim 10, wherein the first target and second target are each formed in different exposures that together form a stitched exposure.

13. The method of claim 12, wherein the first target and second target are subject to different lens aberration effects during their formation.

14. The method of claim 10, further comprising:
calculating a displacement induced phase difference in measurements of the first target and the second target; and
determining the relative placement based on the displacement induced phase difference.

15. The method of claim 14, wherein the displacement induced phase difference comprises a phase difference in at least one higher diffraction order of radiation diffracted from the first target and the second target.

16. The method of claim 15, further comprising:
determining a placement error variation metric describing a placement error variation between corresponding locations of the first target and second target, based on the variation in said displacement induced phase difference.

17. The method of claim 1, wherein the measurement recipe includes parameters relating to target characteristics or illumination characteristics.

18. The method of claim 1, wherein the reference value corresponds to an average value of the characteristic of interest.

19. A lithography or metrology apparatus comprising:
projection optics configured to project radiation toward a target on a substrate;
a detector configured to detect radiation scattered by the target; and
a non-transitory computer readable medium comprising machine-readable instructions configured to cause a processor to perform operations comprising:
calculating a reference value for a characteristic of interest from measurements of the detected radiation scattered by the target at different focus settings; and
adjusting a measurement recipe based on the reference value; and
using the adjusted measurement recipe in a subsequent process to control the metrology or lithographic apparatus.

20. An apparatus comprising:
a substrate holder configured to hold a substrate comprising a structure;
projection optics configured to project illuminating radiation onto the structure;
a detector configured to detect the illuminating radiation subsequent to it having been scattered by the structure; and
a processor for measuring a characteristic of interest relating to the structure on the substrate, the processor being configured to:
calculate a reference value for the characteristic of interest from measurements of the structure at a plurality of different focus settings;
adjust a measurement recipe based on the reference value; and
use the adjusted measurement recipe in a subsequent process performed by the apparatus.

* * * * *